(12) United States Patent
Sasaki et al.

(10) Patent No.: US 10,804,110 B2
(45) Date of Patent: Oct. 13, 2020

(54) SUBSTRATE PROCESSING APPARATUS, METHOD OF MANUFACTURING SEMICONDUCTOR DEVICE AND NON-TRANSISTORY COMPUTER-READABLE RECORDING MEDIUM

(71) Applicant: KOKUSAI ELECTRIC CORPORATION, Tokyo (JP)

(72) Inventors: Shinya Sasaki, Toyama (JP); Noriaki Michita, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/289,850

(22) Filed: Mar. 1, 2019

(65) Prior Publication Data
US 2019/0198331 A1 Jun. 27, 2019

Related U.S. Application Data

(63) Continuation of application No. PCT/JP2016/078031, filed on Sep. 23, 2016.

(51) Int. Cl.
*H01L 21/00* (2006.01)
*H01L 21/30* (2006.01)
(Continued)

(52) U.S. Cl.
CPC .... *H01L 21/3003* (2013.01); *H01J 37/32449* (2013.01); *H01J 37/32899* (2013.01);
(Continued)

(58) Field of Classification Search
CPC ............. H01L 21/3003; H01L 21/3105; H01L 21/6719; H01L 21/02321; H01L 21/0234;
(Continued)

(56) References Cited

U.S. PATENT DOCUMENTS 4,605,447 A 8/1986 Brotherton et al.
7,553,772 B1 * 6/2009 Gu ................... H01L 21/02238
257/E21.328
(Continued)

FOREIGN PATENT DOCUMENTS

JP 59-213137 A 12/1984
JP 61-043417 A 3/1986
(Continued)

OTHER PUBLICATIONS

Japanese Office Action dated Nov. 26, 2019 for the Japanese Patent Application No. 2018-540561.

*Primary Examiner* — Vu A Vu
(74) *Attorney, Agent, or Firm* — Volpe and Koenig, P.C.

(57) ABSTRACT

Described herein is a technique capable of heating a substrate uniformly by electromagnetic waves. According to one aspect of the technique, there is provided a substrate processing apparatus including: a process chamber where a substrate is processed; a heating device configured to heat the substrate by electromagnetic waves; a gas supply mechanism including a hydrogen-containing gas supply system configured to supply a hydrogen-containing gas into the process chamber; a plasma generator configured to excite the hydrogen-containing gas by plasma; and a controller configured to control the heating device, the gas supply mechanism and the plasma generator to modify the substrate by performing: (a) adding hydrogen atom to a surface of the substrate by supplying the hydrogen-containing gas excited by the plasma generator onto the substrate; and (b) intermittently supplying the electromagnetic waves to heat the substrate after performing (a).

15 Claims, 14 Drawing Sheets

(51) Int. Cl.
*H01L 21/67* (2006.01)
*H01J 37/32* (2006.01)
*H01L 21/02* (2006.01)
*H01L 21/311* (2006.01)
*H01L 21/265* (2006.01)
*H01L 21/3105* (2006.01)

(52) U.S. Cl.
CPC ...... *H01L 21/0228* (2013.01); *H01L 21/0234* (2013.01); *H01L 21/02164* (2013.01); *H01L 21/02219* (2013.01); *H01L 21/02274* (2013.01); *H01L 21/02318* (2013.01); *H01L 21/02321* (2013.01); *H01L 21/265* (2013.01); *H01L 21/3105* (2013.01); *H01L 21/31111* (2013.01); *H01L 21/6719* (2013.01); *H01L 21/67115* (2013.01); *H01L 21/67167* (2013.01); *H01J 2237/3341* (2013.01)

(58) Field of Classification Search
CPC ............. H01L 21/02219; H01L 21/265; H01L 21/67167; H01L 21/02318; H01L 21/31111; H01L 21/0228; H01L 21/02274; H01L 21/02164; H01L 21/67115; H01L 21/324; H01J 37/32449; H01J 37/32899; H01J 2237/3341
USPC ........................................................ 438/798
See application file for complete search history.

(56) References Cited

U.S. PATENT DOCUMENTS

2014/0004690 A1    1/2014   Isogai et al.
2014/0024200 A1*   1/2014   Kato ................. H01L 21/02617
                                                    438/473

FOREIGN PATENT DOCUMENTS

| JP | 2011-249780 A | 12/2011 |
| JP | 2012-186189 A | 9/2012 |
| JP | 2014-022653 A | 2/2014 |
| JP | 2015-070045 A | 4/2015 |

* cited by examiner

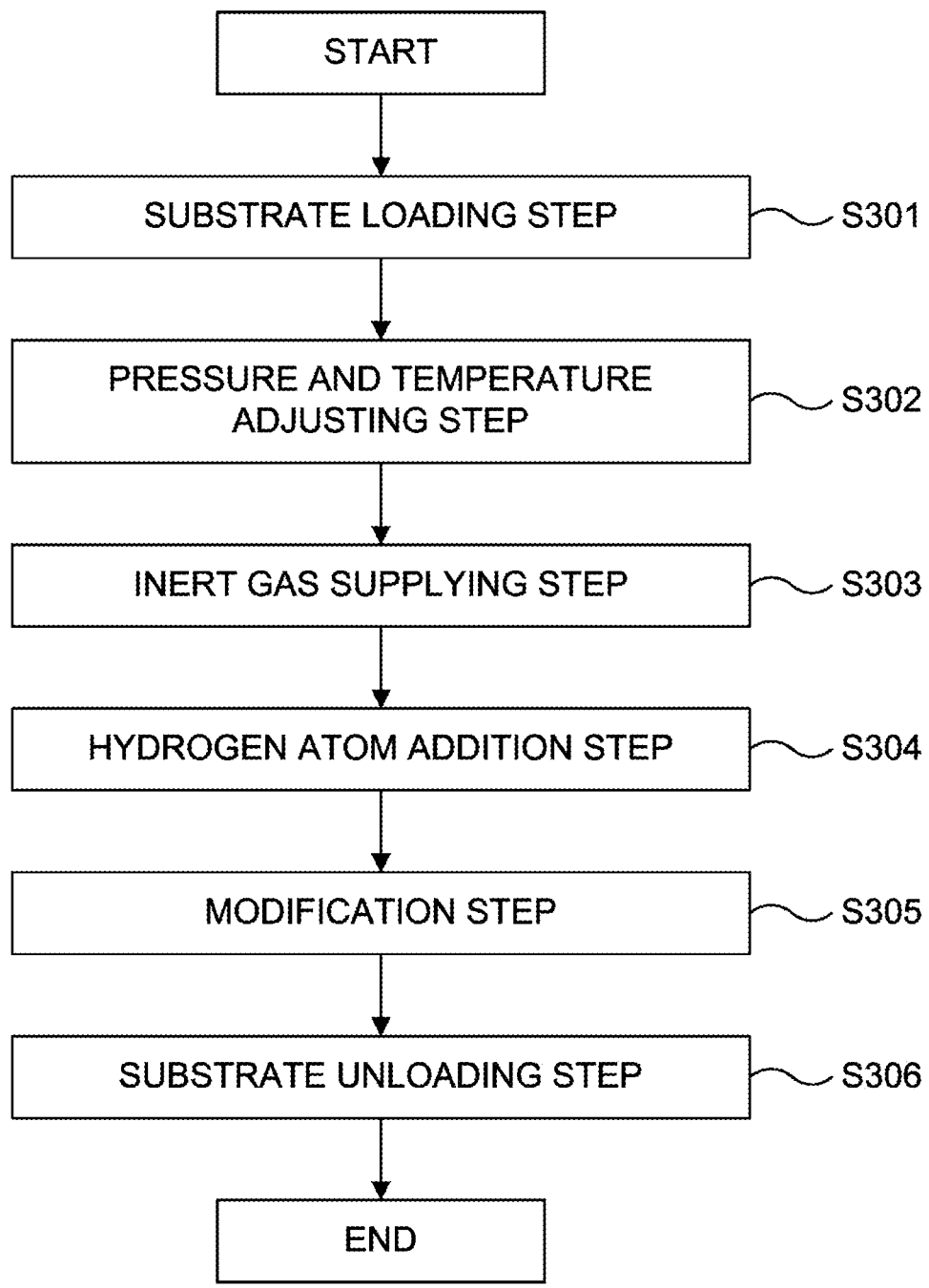

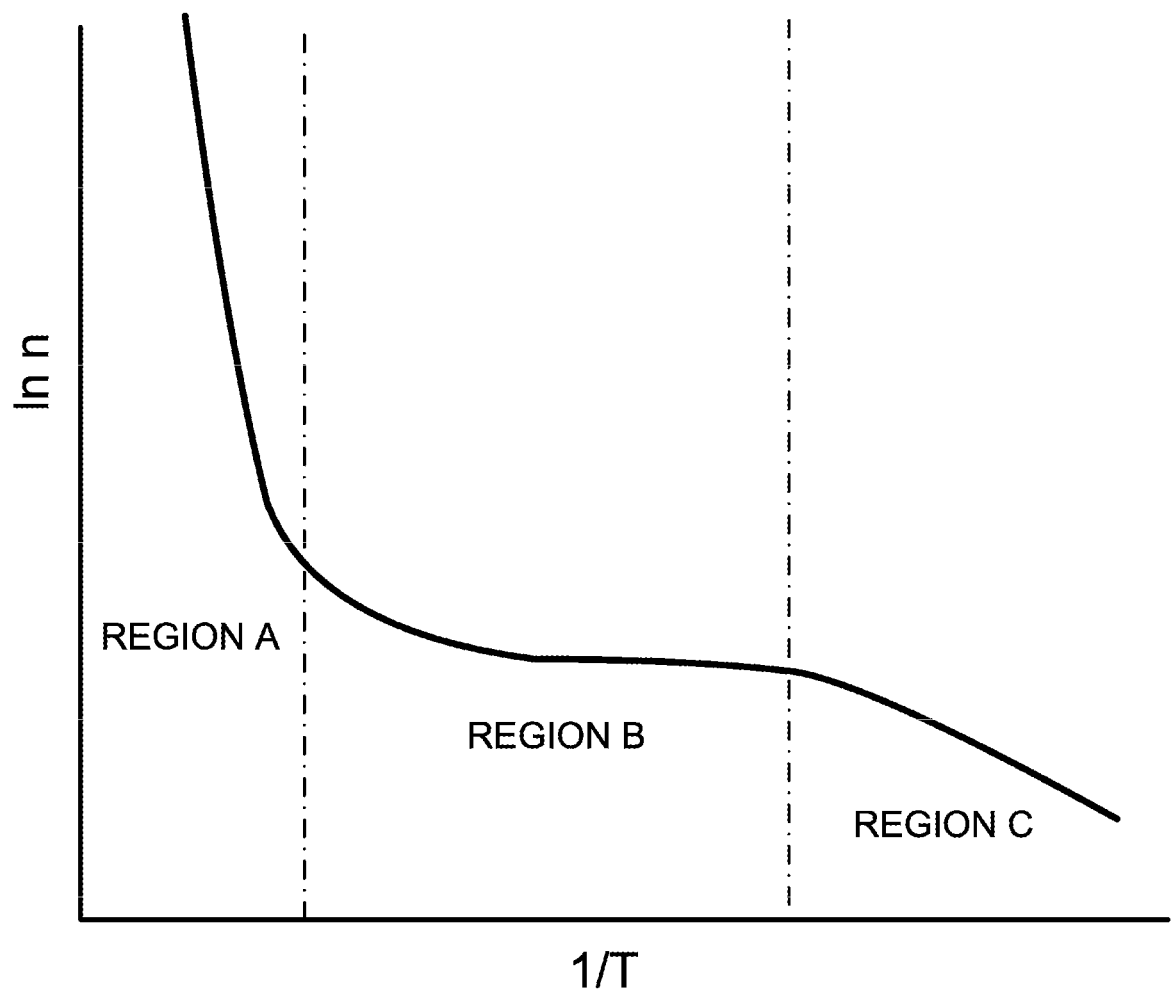

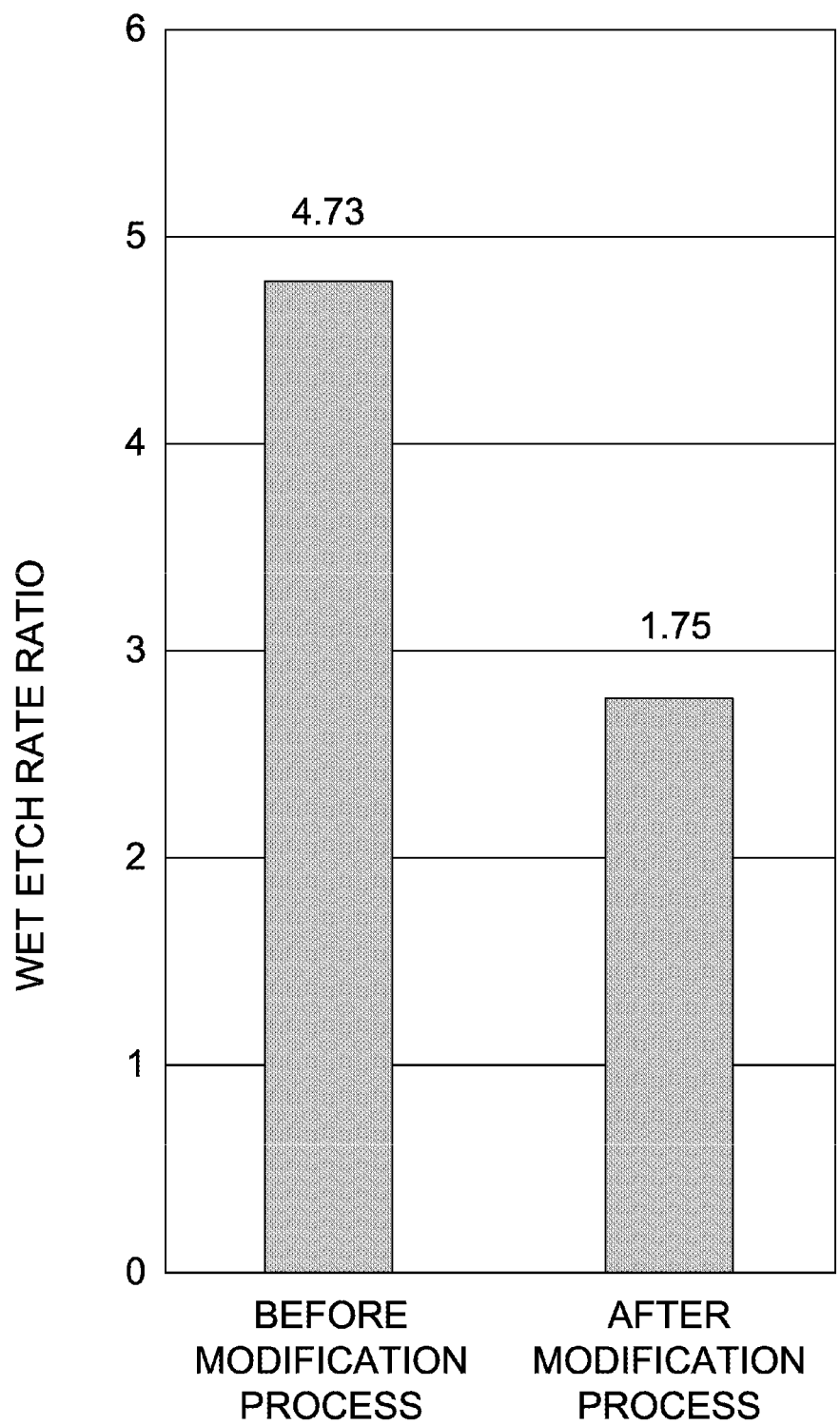

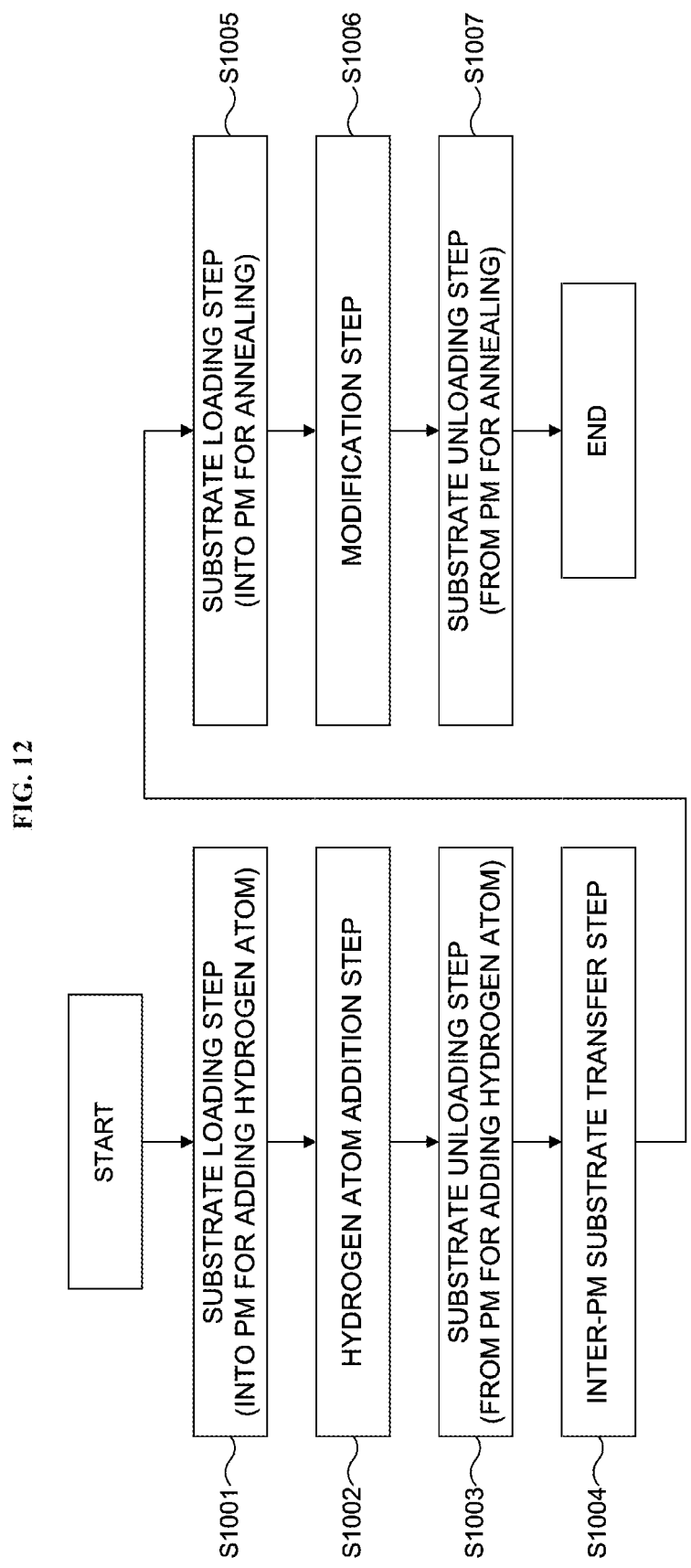

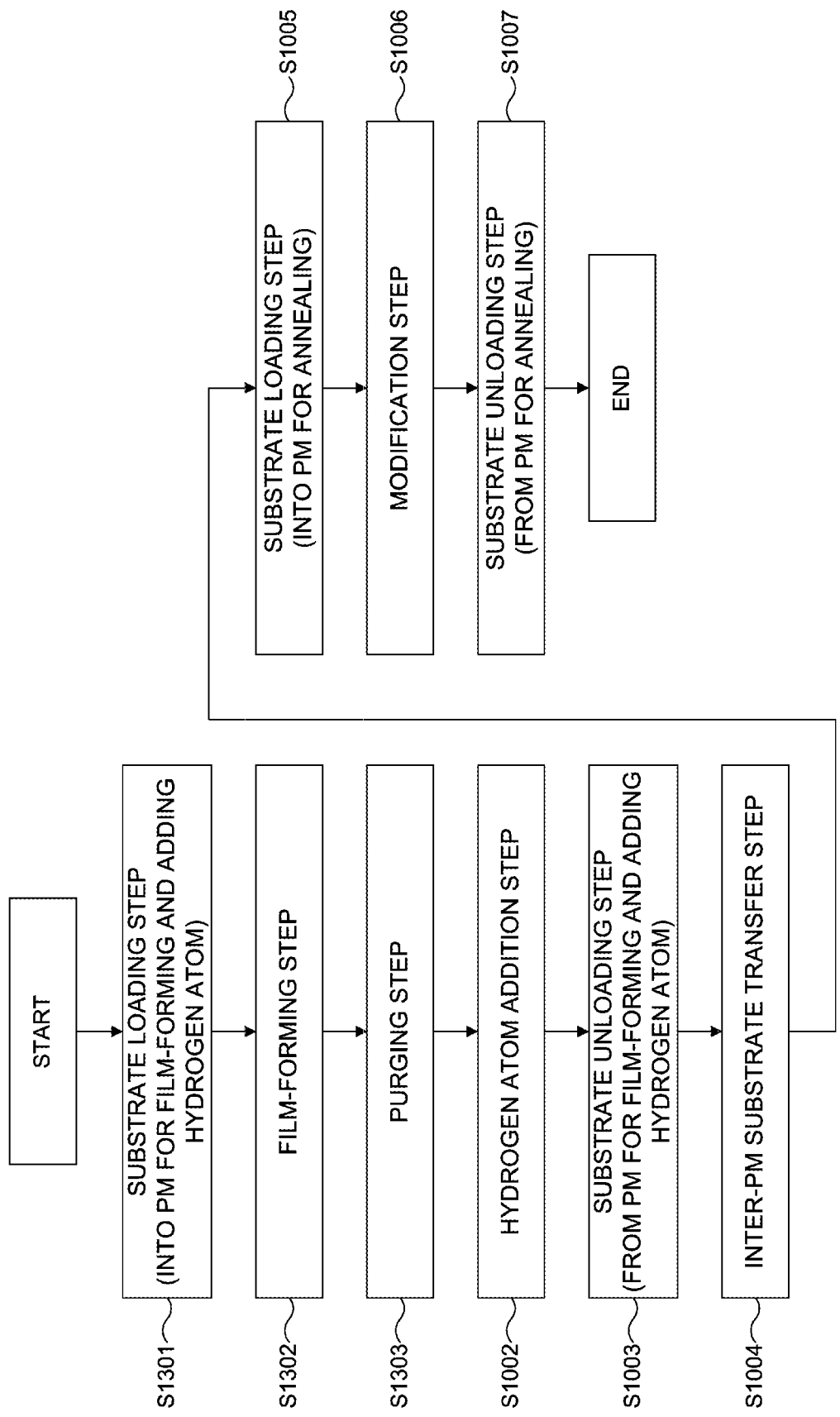

SUBSTRATE PROCESSING APPARATUS, METHOD OF MANUFACTURING SEMICONDUCTOR DEVICE AND NON-TRANSISTORY COMPUTER-READABLE RECORDING MEDIUM

CROSS-REFERENCE TO RELATED PATENT APPLICATION

This non-provisional U.S. patent application claims priority under 35 U.S.C. § 119 of International Application No. PCT/JP2016/078031, filed on Sep. 23, 2016, in the WIPO, the entire contents of which are hereby incorporated by reference.

BACKGROUND

1. Field

The present disclosure relates to a substrate processing apparatus, a method of manufacturing a semiconductor device and a non-transitory computer-readable recording medium.

2. Description of the Related Art

As one of manufacturing processes of a semiconductor device, a modification process such as an annealing process may be performed. For example, the annealing process is performed by heating a substrate in a process chamber by using a heating device to change the compositions and the crystal structures of a film formed on a surface of the substrate or to restore defects such as crystal defects formed in the film. Recently, semiconductor devices are integrated at a high density and remarkably miniaturized. As a result, it is required to provide a modification process capable of modifying a high density substrate on which a pattern having a high aspect ratio is formed. As the modification process capable of modifying the high density substrate, a heat treatment using microwaves may be performed.

However, the heat treatment using the microwaves is greatly affected by the material composition or the kind of the object to be processed (for example, the substrate or the film). This may make it difficult to heat the substrate uniformly.

SUMMARY

Described herein is a technique capable of heating a substrate uniformly by electromagnetic waves.

According to one aspect of the technique described herein, there is provided a substrate processing apparatus including:
a process chamber where a substrate is processed;
a heating device configured to heat the substrate by electromagnetic waves;
a gas supply mechanism including a hydrogen-containing gas supply system configured to supply a hydrogen-containing gas into the process chamber;
a plasma generator configured to excite the hydrogen-containing gas by plasma; and
a controller configured to control each of the heating device, the gas supply mechanism and the plasma generator to modify the substrate by performing: (a) adding hydrogen atom to a surface of the substrate by supplying the hydrogen-containing gas excited by the plasma generator onto the substrate; and (b) intermittently supplying the electromagnetic waves to heat the substrate after performing (a).

BRIEF DESCRIPTION OF THE DRAWINGS

FIG. 3 is a flowchart illustrating a substrate processing preferably used in the first embodiment.

FIG. 4 illustrates an exemplary relation between a carrier density and a carrier temperature.

FIG. 5A is a graph showing wet etch rate ratios of a wafer before and after a modification process wherein a hydrogen addition process is not performed for the wafer and FIG. 5B is a graph showing wet etch rate ratios of the wafer before and after the modification process wherein the hydrogen addition process is performed for the wafer.

FIG. 12 is a flowchart illustrating a substrate processing preferably used in the second embodiment.

FIG. 13 is a flowchart illustrating a substrate processing preferably used in a third embodiment described herein.

DETAILED DESCRIPTION

First Embodiment

Hereinafter, a first embodiment according to the technique will be described with reference to the drawings.

(1) Configuration of Substrate Processing Apparatus

Hereinafter, a substrate processing apparatus 100 preferably used in the first embodiment will be described. In the first embodiment, the substrate processing apparatus 100 includes a single-wafer type heat treatment apparatus configured to perform various heat treatments on a wafer 200. Specifically, an apparatus configured to perform an annealing process (modification process) using electromagnetic waves described later may be used as the substrate processing apparatus (single-wafer type heat treatment apparatus) 100.

<Process Chamber>

Figure 1:
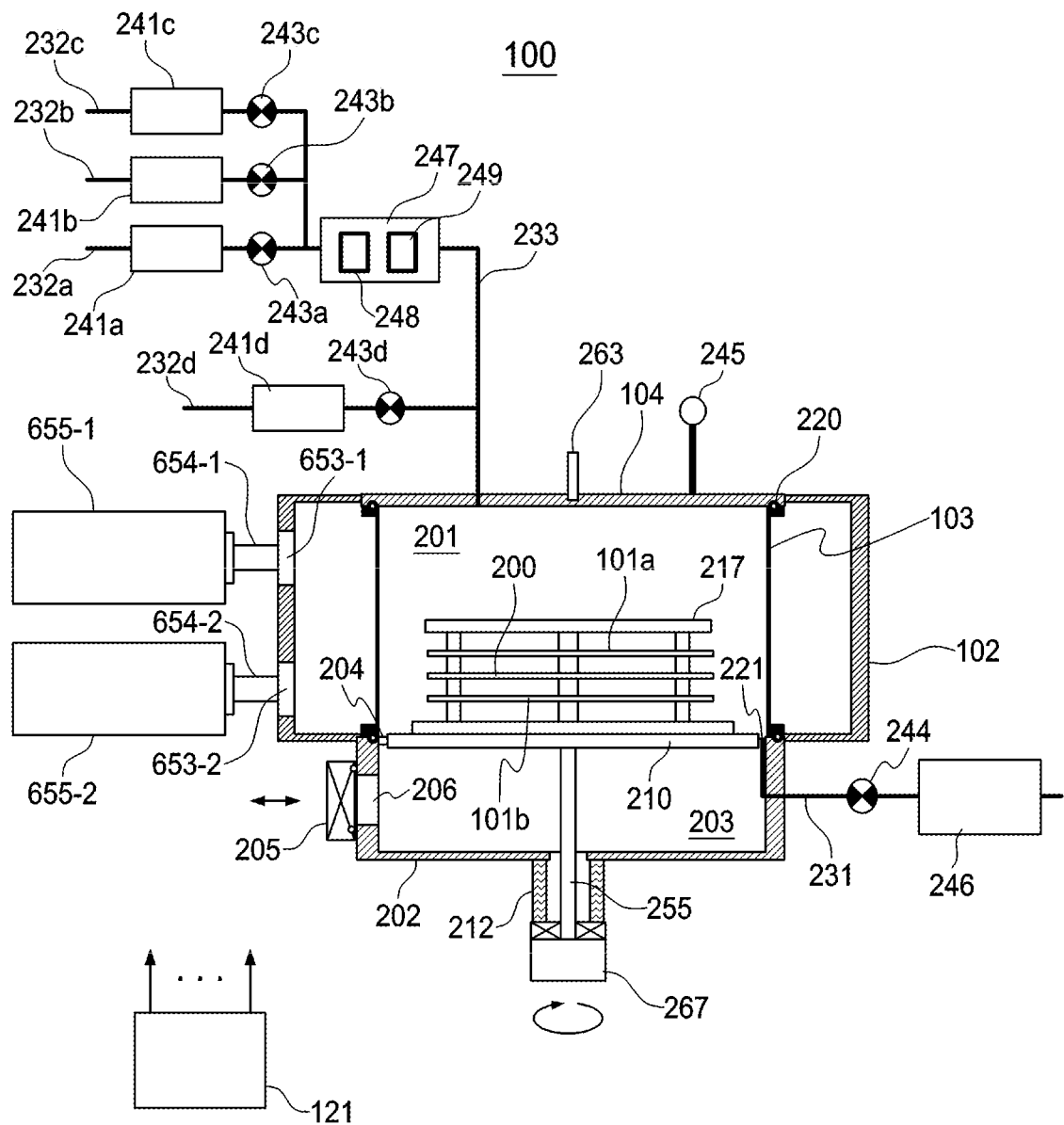
FIG. 1 schematically illustrates a vertical cross-section of a single-wafer type processing furnace of a substrate processing apparatus preferably used in a first embodiment described herein.

As shown in FIG. 1, the substrate processing apparatus 100 according to the first embodiment includes a case 102 serving as a cavity (upper vessel) made of a material such as a metal capable of reflecting electromagnetic waves and a reaction tube 103 accommodated in the case 102. A processing furnace of the substrate processing apparatus 100 is constituted mainly by the case 102 and the reaction tube 103. The reaction tube 103 is of cylindrical shape with open upper and lower ends. The reaction tube 103 is made of a heat resistant material such as quartz capable of transmitting the electromagnetic waves. A cap flange (closing plate) 104 made of a metal material is in contact with the upper end of the reaction tube 103 to seal the upper end of the reaction tube 103 via an O-ring 220 serving as a sealing part. A process vessel for processing a substrate (wafer) 200 such as a silicon wafer is constituted mainly by the case 102, the reaction tube 103 and the cap flange 104. A process chamber 201 is defined by an inner space of the reaction tube 103. However, the substrate processing apparatus 100 may not include the reaction tube 103. When the reaction tube 103 is not included in the substrate processing apparatus 100, the process chamber 201 may be defined by an inner space of the case 102. In addition, the substrate processing apparatus 100 may not include the cap flange 104. When the cap flange 104 is not included in the substrate processing apparatus 100, the process vessel may be defined by the case 102 and the reaction tube 103, or may be defined only by the case 102.

A placement table 210 is provided below the reaction tube 103. A boat 217 serving as a substrate retainer configured to accommodate the wafer 200 serving as the substrate is placed on an upper surface of the placement table 210. The wafer 200 to be processed and plates 101a and 101b serving as heat insulating plates are accommodated in the boat 217 with predetermined intervals. The plates 101a and 101b are placed vertically over and under the wafer 200, respectively, such that the wafer 200 is interposed therebetween. The plates 101a and 101b are disk-shaped, and are made of a material such as quartz capable of transmitting the electromagnetic waves and capable of blocking infrared rays. Hereinafter, the plates 101a and 101b are also referred to as the quartz plates 101a and 101b. The quartz plate 101a and the quartz plate 101b are identical. In the present specification, the quartz plate 101a and the quartz plate 101b may be collectively referred to as a quartz plate 101 unless they need to be distinguished separately. Instead of the quartz plates 101a and 101b, for example, components serving as susceptors (not shown) capable of indirectly heating the wafer 200 may be accommodated in the boat 217. The susceptors are made of a material such as a dielectric material capable of self-heating by absorbing the electromagnetic waves. For example, the susceptors may include a silicon (Si) plate or a silicon carbide (SiC) plate. The susceptors are also referred to as radiation plates or soaking plates. In addition, the susceptors may also be provided together with the quartz plates 101a and 101b. That is, the susceptors may be provided between the quartz plate 101a and the quartz plate 101b and vertically over and under the wafer 200, respectively, such that the wafer 200 is interposed therebetween and the susceptor. One of the susceptors is provided between the quartz plate 101a and the wafer 200, and another of the susceptors is provided between the wafer 200 and the quartz plate 101b. According to the above-described configuration, it is possible to heat the wafer 200 more uniformly and more efficiently.

A protrusion (not shown) protruding from the placement table 210 in the radial direction of the placement table 210 is provided on a bottom surface of the placement table 210. As the protrusion approaches or comes into contact with a partition plate 204 provided between the process chamber 201 and a transfer space 203 described later, it is possible to suppress an inner atmosphere of the process chamber 201 from flowing into the transfer space 203 or to suppress an inner atmosphere of the transfer space 203 from flowing into the process chamber 201.

The case 102 serving as the upper vessel is a flat and sealed vessel having a circular horizontal cross-section. A transfer vessel 202 serving as a lower vessel is made of a metal material such as aluminum (Al) and stainless steel (SUS), or is made of a material such as quartz. The transfer space 203 where the wafer 200 such as the silicon wafer is transferred is provided under the process vessel. A space surrounded by the case 102 or a space surrounded by the reaction tube 103 and above the partition plate 204 may be referred to as the process chamber 201 or as a reaction region 201, and a space surrounded by the transfer vessel 202 and below the partition plate 204 may be referred to as the transfer space 203 or as a transfer region 203. While the process chamber 201 and the transfer region 203 are adjacent to each other in the vertical direction according to the first embodiment as shown in FIG. 1, the first embodiment is not limited thereto. For example, the process chamber 201 and the transfer region 203 may be adjacent to each other in the horizontal direction. In addition, only the process chamber 201 may be provided in the substrate processing apparatus 100 without providing the transfer region 203.

A substrate loading/unloading port 206 is provided at a side wall of the transfer vessel 202 adjacent to a gate valve 205. The wafer 200 is moved between a substrate transfer chamber (not shown) and the transfer space 203 through the substrate loading/unloading port 206.

An electromagnetic wave supply mechanism (electromagnetic wave supply part) serving as a heating device described later in detail is provided at a side wall of the case 102. The electromagnetic waves such as microwaves supplied through the electromagnetic wave supply mechanism are introduced into the process chamber 201 to heat the components such as the wafer 200 and to process the wafer 200.

The placement table 210 is supported by a shaft 255 serving as a rotating shaft. The shaft 255 penetrates the bottom of the transfer vessel 202 and is connected to a driving mechanism 267 at an outside of the transfer vessel 202. The driving mechanism 267 is configured to perform operations such as a rotation operation and an elevating operation. The wafer 200 placed on the boat 2174 may be rotated, elevated or lowered by rotating, elevating or lowering the shaft 255 and the placement table 210 by operating the driving mechanism 267. A bellows 212 covers a lower end portion of the shaft 255 to maintain an inside of the process chamber 201 and an inside of the transfer region 203 airtight.

When the wafer 200 is transferred, the placement table 210 is lowered until the upper surface of the placement table 210 is at a height of the substrate loading/unloading port 206 (hereinafter, also referred to as "wafer transfer position"). When the wafer 200 is processed, the placement table 210 is elevated until the wafer 200 reaches a processing position in the process chamber 201 (hereinafter, also referred to as a "wafer processing position"). As described above, when the process chamber 201 and the transfer region 203 are adjacent to each other in the horizontal direction, or when only the process chamber 201 is provided without providing the transfer region 203, the driving mechanism 267 may be configured to perform only the rotation of the placement table 210 without elevating or lowering the placement table 210.

<Exhaust Mechanism>

An exhaust mechanism configured to exhaust the inner atmosphere of the process chamber 201 is provided below the process chamber 201 on the outer circumference of the placement table 210. As shown in FIG. 1, an exhaust port 221 is provided in the exhaust mechanism. An exhaust pipe 231 is connected to the exhaust port 221. A pressure controller (hereinafter, also referred to as a "pressure adjusting mechanism") 244 such as an APC (Automatic Pressure Controller) valve and a vacuum pump 246 are sequentially connected to the exhaust pipe 231 in series. For example, an APC valve capable of adjusting an opening degree thereof in accordance with an inner pressure of the process chamber 201 may be used as the pressure controller 244. Hereinafter, the pressure controller 244 may also be referred to as the APC valve 244. However, in the first embodiment, the pressure controller 244 is not limited thereto. The pressure controller 244 may be embodied by a combination of a conventional on-off valve and a pressure regulating valve so long as it is possible to receive information on the inner pressure of the process chamber 201 (that is, a feedback signal from a pressure sensor 245 described later) and to adjust the exhaust amount based on the received information.

The exhaust mechanism (also referred to as an "exhaust system" or an "exhaust line") is configured mainly by the exhaust port 221, the exhaust pipe 231 and the pressure controller 244. It is also possible to configure the exhaust port 221 to surround the placement table 210 such that the gas may be exhausted from the entire circumference of the wafer 200 through the exhaust port 221 surrounding the placement table 210. The exhaust mechanism may further include the vacuum pump 246.

<Gas Supply System>

The cap flange 104 is provided with a common gas supply pipe 233 configured to supply process gases such as inert gas, a source gas, a reactive gas and a modification gas used for performing various substrate processing into the process chamber 201. A gas supply pipe 232a is connected to the common gas supply pipe 233. A mass flow controller (WC) 241a serving as a flow rate controller (flow rate control mechanism), a valves 243a serving as an opening/closing valve and a remote plasma mechanism 247 are sequentially installed at the gas supply pipe 232a from the upstream side to the downstream side of the gas supply pipe 232a.

A hydrogen (H)-containing gas source (not shown) serving as a source containing hydrogen (H) atom as a predetermined element is connected to the upstream side of the gas supply pipe 232a, and the hydrogen-containing gas serving as the modification gas is supplied to the remote plasma mechanism 247 via the WC 241a and the valve 243a. Thereafter, hydrogen active species (hereinafter, also referred to as "hydrogen radicals" or "H*") excited by the remote plasma mechanism 247 is supplied into the process chamber 201 from above the process chamber 201. For example, a gas such as hydrogen ($H_2$) gas, $H_2O$ gas, $H_2O_2$ gas, a gas containing deuterium (D) and a gaseous mixture thereof may be used as the hydrogen-containing gas.

A gas supply system (gas supply mechanism) is constituted mainly by the gas supply pipe 232a, the MFC 241a and the valve 243a. When the modification gas is supplied through the gas supply system, the gas supply system may also be referred to as a modification gas supply system. When the source gas or the reactive gas is supplied through the gas supply system, the gas supply system may also be referred to as a source gas supply system or a reactive gas supply system, respectively. The gas supply system may further include the remote plasma mechanism 247 and the common gas supply pipe 233. In addition, the gas supply system may further include at least one of a first inert gas supply system, a carrier gas supply system and a second inert gas supply system, which will be described later. For example, the gas supply system may further include all of the first inert gas supply system, the carrier gas supply system and the second inert gas supply system.

A gas supply pipe 232b for supplying a first inert gas and a gas supply pipe 232c for supplying a carrier gas are connected to the gas supply pipe 232a between the valve 243a and the remote plasma mechanism 247, respectively. MFCs 241b and 241c and valves 243b and 243c are sequentially installed at the gas supply pipes 232b and 232c, respectively, from the upstream sides to the downstream sides of the gas supply pipes 232b and 232c.

A first inert gas source (not shown) serving as a source of the first inert gas is connected to the upstream side of the gas supply pipe 232b, and the first inert gas is supplied into the process chamber 201 via the gas supply pipe 232b provided with the MFC 241b and the valve 243b, the gas supply pipe 232a and the common gas supply pipe 233. For example, a rare gas such as nitrogen ($N_2$) gas, helium (He) gas, neon (Ne) gas and argon (Ar) gas may be used as the first inert gas. The first inert gas supply system (first inert gas supply mechanism) is constituted mainly by the gas supply pipe 232b, the MFC 241b and the valve 243b.

A carrier gas source (not shown) serving as a source of the carrier gas is connected to the upstream side of the gas supply pipe 232c, and the carrier gas is supplied into the process chamber 201 via the gas supply pipe 232c provided with the MFC 241c and the valve 243c, the gas supply pipe 232a and the common gas supply pipe 233. For example, argon (Ar) gas may be used as the carrier gas. The carrier gas supply system (carrier gas supply mechanism) is constituted mainly by the gas supply pipe 232c, the MFC 241c and the valve 243c.

A gas supply pipe 232d for supplying a second inert gas is connected to the common gas supply pipe 233 at the downstream side of the remote plasma mechanism 247. An MFC 241d and a valve 243d are sequentially installed at the gas supply pipe 232d from the upstream side to the downstream side of the gas supply pipe 232d. A second inert gas source (not shown) serving as a source of the second inert gas is connected to the upstream side of the gas supply pipe 232d, and the second inert gas is supplied into the process chamber 201 via the gas supply pipe 232d provided with the MFC 241d and the valve 243d and the common gas supply pipe 233. Similar to the first inert gas, for example, a rare gas such as nitrogen ($N_2$) gas, helium (He) gas, neon (Ne) gas and argon (Ar) gas may be used as the second inert gas. The second inert gas may be identical to or different from the first inert gas. The second inert gas supply system (second inert gas supply mechanism) is constituted mainly by the gas supply pipe 232d, the MFC 241d and the valve 243d.

<Plasma Generator>

A remote plasma mechanism 247 serving as a plasma generator is configured by connecting a high frequency power supply 248 and a matching mechanism 249 in a plasma generation space (not shown). Plasma is generated by adjusting the impedance by the high frequency power supply 248 and the matching mechanism 249. The generated plasma excites the modification gas supplied into the plasma generation space to generate active species (radicals), and the generated active species is supplied into the process chamber 201. In order to generate the plasma, any method may be used. For example, plasma such as a capacitively coupled plasma (abbreviated as CCP), an inductively coupled plasma (abbreviated as ICP), an electron cyclotron resonance plasma (abbreviated as ECR plasma), a helicon wave excited plasma (abbreviated as HWP) and a surface wave plasma (abbreviated as SWP) may be used.

<Temperature Sensor>

A temperature sensor 263 serving as a non-contact type temperature detector is provided at the cap flange 104. By adjusting the output of a microwave oscillator 655 described later based on the temperature information detected by the temperature sensor 263, the wafer (substrate) 200 is heated such that the temperature of the wafer 200 has a desired temperature distribution. For example, the temperature sensor 263 is constituted by a radiation thermometer such as an IR (Infrared Radiation) sensor. The temperature sensor 263 is provided so as to measure a surface temperature of the quartz plate 101a or a surface temperature of the wafer 200. When the susceptor as a heating element described above is provided, the temperature sensor 263 may measure a surface temperature of the susceptor. In the present specification, the term "temperature of the wafer 200" (or wafer temperature) may indicate only a wafer temperature converted by temperature conversion data described later (that is, an estimated wafer temperature), or only a temperature obtained directly by measuring the temperature of the wafer 200 by the temperature sensor 263, or indicate both of them.

When the surface temperature of the quartz plate 101a is measured using the temperature sensor 263, a measurement hole (not shown) serving as a temperature measurement window is provided in a top plate 217a of the boat 217 at a position facing the temperature sensor 263 such that the top plate (ceiling) 217a of the boat 217 does not affect the temperature measurement of the temperature sensor 263. The temperature sensor 263 can measure the surface temperature of the quartz plate 101a through the measurement hole provided in the top plate 217a. When the surface temperature of the wafer 200 is measured using the temperature sensor 263, similar to the measurement hole provided in the top plate 217a, a measurement hole (not shown) serving as a temperature measurement window is provided in the quartz plate 101a at a position corresponding to the measurement hole provided in the top plate 217a. The temperature sensor 263 can measure the surface temperature of the wafer 200 through the measurement hole provided in the top plate 217a and the measurement hole provided in the quartz plate 101a. The temperature of the quartz plate 101 and temperature of the wafer 200 are measured in a preparation step before a substrate processing described later is performed. It is preferable to acquire history data of temperature change of the quartz plate 101 and the wafer 200 in the substrate processing in advance. By acquiring the history data of the temperature change of the quartz plate 101 and the wafer 200 as described above, the temperature conversion data indicating a correlation between the temperature of the quartz plate 101 and the temperature of the wafer 200 may be stored in a memory device 121c or may be stored in an external storage device 123, which will be described later. By preparing the temperature conversion data in advance as described above, it is possible to estimate the temperature of the wafer 200 only by measuring the temperature of the quartz plate 101, and the output of the microwave oscillator 655 serving as a heating device may be controlled based on the estimated temperature of the wafer 200.

While the radiation thermometer is exemplified as the temperature sensor 263 according to the first embodiment, the first embodiment is not limited thereto. A thermocouple may be used as the temperature sensor 263 to measure the temperature of the wafer 200, or both the thermocouple and the non-contact type temperature detector (non-contact type thermometer) may be used as the temperature sensor 263 to measure the temperature of the wafer 200. However, when the thermocouple is used as the temperature sensor 263 to measure the temperature of the wafer 200, it is necessary to provide (place) the thermocouple in the vicinity of the wafer 200 to measure the temperature the wafer 200. That is, since it is necessary to provide the thermocouple in the process chamber 201, the thermocouple itself is heated by the microwaves supplied from the microwave oscillator 655 described later. As a result, it is impossible to accurately measure the temperature of the wafer 200. Therefore, it is preferable to use the non-contact type thermometer as the temperature sensor 263. While the temperature sensor 263 is provided at the cap flange 104 according to the first embodiment, the first embodiment is not limited thereto. For example, the temperature sensor 263 may be provided at the placement table 210. While the temperature sensor 263 is provided at the cap flange 104 or the placement table 210 to directly measure the temperature according to the first embodiment, the first embodiment is not limited thereto. For example, the temperature sensor 263 may measure the temperature indirectly by measuring the radiation reflected by the components such as a mirror and emitted through the measurement window provided in the cap flange 104 or the placement table 210. While only one temperature sensor 263 is shown in FIG. 1 according to the first embodiment, the first embodiment is not limited thereto. A plurality of the temperature sensors 263 may be provided according to the first embodiment.

<Electromagnetic Wave Supply Mechanism>

Electromagnetic wave introduction ports 653-1 and 653-2 are provided at a side wall of the case 102. One end of each of waveguides 654-1 and 654-2 configured to supply the electromagnetic waves into the process chamber 201 is connected to the electromagnetic wave introduction port 653-1 or 653-2. The other end of each of the waveguides 654-1 and 654-2 is connected to either of microwave oscillators (hereinafter, also referred to as electromagnetic wave sources) 655-1 and 655-2 serving as heating sources configured to supply electromagnetic waves into the process chamber 201 to heat process chamber 201. The microwave oscillators 655-1 and 655-2 supply the electromagnetic waves such as the microwaves to the waveguides 654-1 and 654-2, respectively. For example, a magnetron or a klystron may be used as the microwave oscillators 655-1 and 655-2. In the present specification, unless they need to be distinguished separately, the electromagnetic wave introduction ports 653-1 and 653-2 may be collectively referred to as an electromagnetic wave introduction port 653, the waveguides 654-1 and 654-2 may be collectively referred to as a waveguide 654 and the microwave oscillators 655-1 and 655-2 may be collectively referred to as the microwave oscillator 655.

Preferably, a frequency of the electromagnetic waves generated by the microwave oscillator 655 is controlled such that the frequency is within a range from 13.56 MHz to 24.125 GHz. More preferably, the frequency is controlled to a frequency of 2.45 GHz or 5.8 GHz. In the first embodiment, the frequencies of the microwave oscillators 655-1 and 655-2 may be the same or may be different from each other. While the two microwave oscillators 655-1 and 655-2 are provided on the same side wall of the case 102 according to the first embodiment, the first embodiment is not limited thereto. For example, the microwave oscillator 655 including at least one microwave oscillator may be provided according to the first embodiment. In addition, the microwave oscillator 655-1 may be provided on the side wall of the case 102 and the microwave oscillator 655-2 may be provided on another side wall of the case 102 such as a sidewall facing the side wall of the case 102. The electromagnetic wave supply mechanism serving as a heating device is constituted mainly by the microwave oscillators 655-1 and 655-2, the waveguides 654-1 and 654-2 and the electromagnetic wave introduction ports 653-1 and 653-2. Hereinafter, the heating of the wafer 200 by the electromagnetic wave supply mechanism may be simply referred to as a "microwave heating". The electromagnetic wave supply mechanism may also be referred to as an electromagnetic wave supply apparatus, a microwave supply mechanism or a microwave supply apparatus.

A controller 121 described later is connected to the microwave oscillators 655-1 and 655-2. The temperature sensor 263 configured to measure the temperature of the wafer 200 or the temperature of the quartz plate 101a or 101b is connected to the controller 121. The temperature sensor 263 is configured to measures the temperature of the quartz plate 101 or the wafer 200 as described above and to transmit the measured temperature to the controller 121. The controller 121 is configured to control the heating of the wafer 200 by controlling the outputs of the microwave oscillators 655-1 and 655-2. In order to control the heating of the wafer 200 by the heating device, for example, the voltage input to the microwave oscillator 655 may be controlled or a ratio between the time amounts for which the power supply of the microwave oscillator 655 is in ON state and in OFF state may be changed.

In the first embodiment, the microwave oscillators 655-1 and 655-2 are controlled by the same control signal transmitted from the controller 121. However, the first embodiment is not limited thereto. For example, the microwave oscillator 655-1 and the microwave oscillator 655-2 may be individually controlled by individual control signals transmitted from the controller 121 to the microwave oscillator 655-1 and the microwave oscillator 655-2, respectively.

<Controller>

Figure 2:
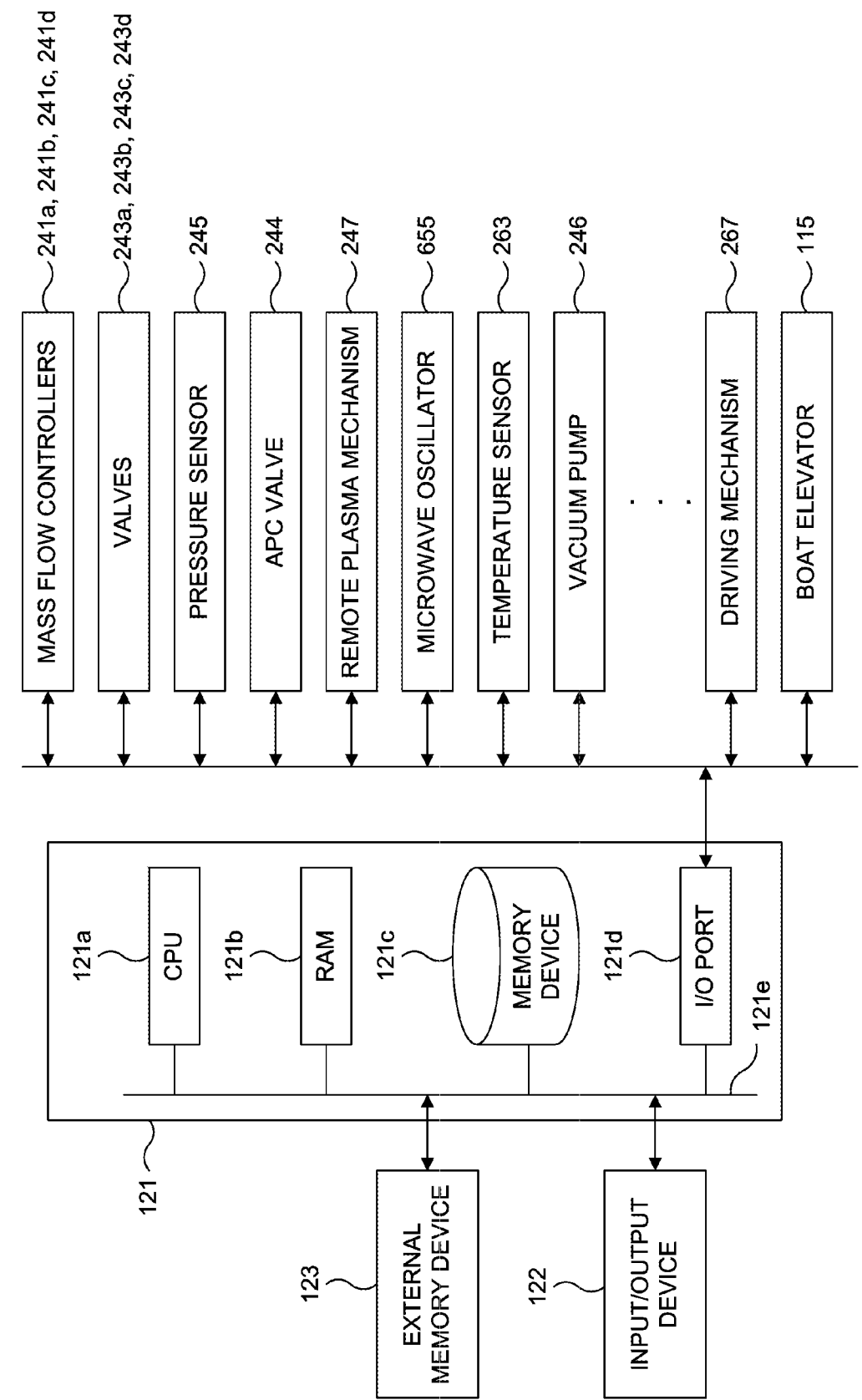
FIG. 2 is a block diagram schematically illustrating a configuration of a controller and components controlled by the controller of the substrate processing apparatus preferably used in the first embodiment

As shown in FIG. 2, the controller 121 serving as a control mechanism (control apparatus or control device) is constituted by a computer including a CPU (Central Processing Unit) 121a, a RAM (Random Access Memory) 121b, a memory device 121c and an I/O port 121d. The RAM 121b, the memory device 121c and the I/O port 121d may exchange data with the CPU 121a through an internal bus 121e. For example, an input/output device 122 such as a touch panel is connected to the controller 121.

The memory device 121c is configured by components such as a flash memory and HDD (Hard Disk Drive). For example, a control program for controlling the operation of the substrate processing apparatus 100, a process recipe containing information on the sequences and conditions of a substrate processing such as a hydrogen (H) atom addition process and an annealing (modification) process described later are readably stored in the memory device 121c. The process recipe is obtained by combining steps of the substrate processing described later such that the controller 121 can execute the steps to acquire a predetermine result, and functions as a program. Hereafter, the process recipe and the control program may be collectively referred to as a "program", and the process recipe may be simply referred to as a recipe. In the present specification, the term "program" may indicate only the process recipe, indicate only the control program, or indicate both of the process recipe and the control program. The RAM 121b is a memory area (work area) where a program or data read by the CPU 121a is temporarily stored.

The I/O port 121d is connected to the above-described components such as the mass flow controllers (MFCs) 241a, 241b, 241c and 241d, the valves 243a, 243b, 243c and 243d, the pressure sensor 245, the APC valve 244, the remote plasma mechanism 247, the microwave oscillator 655, the temperature sensor 263, the vacuum pump 246, the driving mechanism 267 and the boat elevator 115.

The CPU 121a is configured to read a control program from the memory device 121c and execute the read control program. Furthermore, the CPU 121a is configured to read a recipe from the memory device 121c according to an operation command inputted from the input/output device 122. According to the contents of the read recipe, the CPU 121a may be configured to control various operations such as flow rate adjusting operations for various gases by the MFCs 241a, 241b, 241c and 241d, opening/closing operations of the valves 243a, 243b, 243c and 243d, a pressure adjusting operation by the APC valve 244 based on the pressure sensor 245, a start and stop of the vacuum pump 246, an output adjusting operation by the microwave oscillator 655 based on the temperature sensor 263, an operation of adjusting rotation and rotation speed of the placement table 210 (that is, an operation of adjusting rotation and rotation speed of the boat 217) by the driving mechanism 267 and an elevating and lowering operation of the placement table 210 (that is, an elevating and lowering operation of the boat 217) by the driving mechanism 267.

The controller 121 may be embodied by installing the above-described program stored in an external memory device 123 into a computer. For example, the external memory device 123 may include a magnetic disk such as a hard disk, an optical disk such as a CD, a magneto-optical disk such as MO, and a semiconductor memory such as a USB memory. The memory device 121c or the external memory device 123 may be embodied by a non-transitory computer readable recording medium. Hereafter, the memory device 121c and the external memory device 123 are collectively referred to as recording media. In the present specification, the term "recording media" may indicate only the memory device 121c, indicate only the external memory device 123, and indicate both of the memory device 121c and the external memory device 123. Instead of the external memory device 123, a communication means such as the Internet and a dedicated line may be used for providing the program to the computer.

(2) Substrate Processing

Hereinafter, an exemplary sequence of the substrate processing of modifying a film such as a silicon oxide ($SiO_2$) film serving as a silicon-containing film formed on the substrate (wafer) 200, which is a part of manufacturing processes of a semiconductor device, will be described with reference to FIG. 3. The exemplary sequence of the substrate processing is performed by using the processing furnace of the above-described substrate processing apparatus 100. Hereinafter, the components of the substrate processing apparatus 100 are controlled by the controller 121.

In the present specification, the term "wafer" may refer to "a wafer itself" or refer to "a wafer and a stacked structure (aggregated structure) of predetermined layers or films formed on a surface of the wafer". In addition, "surface of a wafer" refers to "a surface (exposed surface) of the wafer itself" or "the surface of a predetermined layer or film formed on the wafer, i.e. a top surface of the wafer as a stacked structure". Thus, in the present specification, "forming a predetermined layer (or film) on a wafer" may refer to "forming a predetermined layer (or film) on a surface of the wafer itself" or refer to "forming a predetermined layer (or film) on a surface of a layer or a film formed on the wafer". In the present specification, "substrate" and "wafer" may be used as substantially the same meaning. That is, the term "substrate" may be substituted by "wafer" and vice versa.

<Substrate Loading Step S301>

As shown in FIG. 1, after a predetermined number of wafers 200 on which an $SiO_2$ film to be processed is formed on the surfaces thereof is transferred into the boat 217, the boat 217 is loaded into the process chamber 201 provided in the reaction tube 103 by elevating the placement table 210 by the driving mechanism 267 (boat loading) (S301).

<Pressure and Temperature Adjusting Step S302>

After the boat 217 is loaded into the process chamber 201, an inner atmosphere of the process chamber 201 is controlled (adjusted) so that the inner pressure of the process chamber 201 is equal to a predetermined pressure. For example, the inner pressure of the process chamber 201 may range from 10 Pa to 102,000 Pa. Specifically, the opening degree of the pressure controller 244 is feedback-controlled based on the pressure information detected by the pressure sensor 245 to adjust the inner pressure of the process chamber 201 to the predetermined pressure while vacuum-exhausting the process chamber 201 by the vacuum pump 246. In addition, the electromagnetic wave supply mechanism may be controlled so as to heat the process chamber 201 to a predetermined temperature (S302) as a preliminary heating. When an inner temperature of the process chamber 201 is raised to the predetermined temperature (substrate processing temperature) by the electromagnetic wave supply mechanism, it is preferable to raise the temperature while an output of the electromagnetic wave supply mechanism is controlled to be less than that of the electromagnetic wave supply mechanism when the modification process described later is performed. In this manner, it is possible to prevent the wafer 200 from being deformed or damaged. In addition, when the substrate processing is performed under atmospheric pressure, an inert gas supply step S303 described later may be performed after adjusting only the inner temperature of the process chamber 201 without adjusting the inner pressure of the process chamber 201.

<Inert Gas Supplying Step S303>

After the inner pressure and the inner temperature of the process chamber 201 are controlled to predetermined values by the pressure and temperature adjusting step S302, the driving mechanism 267 rotates the shaft 255 and rotates the wafer 200 via the boat 217 on the placement table 210. While the driving mechanism 267 rotates the wafer 200, the valve 243b is opened to supply the first inert gas into the process chamber 201 through the gas supply pipe 232b (S303). Alternatively, the driving mechanism 267 may rotate the shaft 255 after the above-described substrate loading step S301 is completed. According to the first embodiment, for example, the $N_2$ gas is supplied as the first inert gas.

<Hydrogen Atom Addition Step S304>

Thereafter, a hydrogen (H) atom addition process is performed by supplying a gas containing hydrogen atoms (also referred to as a hydrogen-containing gas) serving as a process gas into the process chamber 201 and adding the hydrogen atoms to the $SiO_2$ film by plasma-exciting the gas containing hydrogen atoms (S304). According to the first embodiment, for example, the $H_2$ gas is supplied as the hydrogen-containing gas. The hydrogen atom addition process performed by the hydrogen atom addition step S304 will be described in detail.

When the wafer 200 is heated by the electromagnetic wave supply mechanism to the substrate processing temperature of the hydrogen atom addition process ranging from 100° C. to 500° C., the valve 243a is opened to supply the $H_2$ gas into the process chamber 201 through the remote plasma mechanism 247. Specifically, the valve 243a is opened, and the $H_2$ gas is supplied into the process chamber 201 through the remote plasma mechanism 247 while the flow rate of the $H_2$ gas is adjusted by the MFC 241a. In addition, the valve 243c may be opened to supply the carrier gas (dilution gas) into the process chamber 201 through the gas supply pipe 232c provided with the MFC 241c. In the hydrogen atom addition step S304, the supply amount of the $H_2$ gas is adjusted to a predetermined supply amount. For example, the supply amount of the $H_2$ gas may range from 50 sccm to 2,000 sccm. For example, in the first embodiment, the supply amount of the $H_2$ gas is set to 400 sccm. In addition, for example, argon (Ar) gas is supplied as the carrier gas.

In the hydrogen atom addition step S304, the inside of the process chamber 201 is exhausted by adjusting the opening degree of the APC valve 244 so that the inner pressure of the process chamber 201 reaches a predetermined pressure. For example, in the hydrogen atom addition step S304, the inner pressure of the process chamber 201 may range from 10 Pa to 400 Pa, preferably from 50 Pa to 300 Pa. For example, in the first embodiment, the inner pressure of the process chamber 201 is set to 150 Pa. As described above, the $H_2$ gas is continuously supplied into the process chamber 201 while appropriately exhausting the inside of the process chamber 201 until the modification step S305 described later is completed.

When the $H_2$ gas is supplied to the remote plasma mechanism 247, the high frequency power is applied to the remote plasma mechanism 247 by the high frequency power supply 248. For example, a high frequency power of 27.12 MHz with electric power higher than or equal to 0.5 KW and lower than or equal to 3.5 KW is applied to the remote plasma mechanism 247. For example, in the first embodiment, a high frequency power of 2.5 KW is applied. As a result, the plasma is generated in the remote plasma mechanism 247. The $H_2$ gas is activated and dissociated by the generated plasma, and an active species (H*) containing hydrogen atoms is generated.

The gas containing the active species (H*) containing hydrogen atoms generated by activating the $H_2$ gas by the plasma is supplied onto the surface (exposed surface) of the wafer 200 and reacts with the $SiO_2$ film on the surface of the wafer 200. That is, the gas containing the active species (H*) reacts with the $SiO_2$ film on the surface of the wafer 200 to add hydrogen (H) atoms to the $SiO_2$ film on the surface of the wafer 200. Thereby, the hydrogen atom addition process is performed (S304).

According to the first embodiment, the hydrogen-containing gas is supplied to the remote plasma mechanism 247 and excited by the plasma to generated reactive species such as the active species. However, the first embodiment is not limited thereto. For example, it is also possible to generate the plasma in the process chamber 201 and to add hydrogen atoms to the wafer 200.

After a predetermined processing time elapses from the application of the high frequency power, for example, after 10 seconds to 1,200 seconds elapse, the output of the power from the high frequency power supply 248 is stopped to stop the plasma discharge in the process chamber 201. In the first embodiment, for example, the predetermined processing time is set to 120 seconds. In addition, the valve 243a is closed to stop the supply of $H_2$ gas into the process chamber 201. After the supply of $H_2$ gas is stopped, the valve 243b may be opened to purge the inside of the process chamber 201 with the inert gas (first inert gas) if necessary. As described above, by replacing the inner atmosphere of the process chamber 201 with the first inert gas after the hydrogen atom addition process is completed, it is possible to purge a residual gas such as the $H_2$ gas remaining in the process chamber 201 and to suppress the influence of the residual gas in the modification step S305 described later.

In the hydrogen atom addition step S304, the content of hydrogen atom added to the wafer 200 is preferably controlled (adjusted) so that it may range from 0.5% to 80% in the target film where the hydrogen atoms are added. Preferably, the hydrogen atom content may range from 1.0% to 10% in the target film. By controlling the hydrogen atom content as described above, it possible to efficiently heat the wafer 200 in the modification step S305 described later. When the hydrogen atom content is less than 0.5% in the target film, the hydrogen atoms are desorbed from the wafer 200 by the heat energy generated during the hydrogen atom addition process or by the microwave heating in the modification process described later. Therefore, the absorption efficiency of the microwave may be lowered and it is difficult to obtain a predetermined modification effect. In addition, when the hydrogen atom content is greater than 80%, the properties of the film (target film) may be changed. Therefore, it is preferable to adjust the hydrogen atom content to be within the range described above.

<Modification Step S305>

After the hydrogen atom addition step S304 is completed, the valve 243b is opened to supply the first inert gas into the process chamber 201 through the gas supply pipe 232b. In the modification step S305, the inner pressure of the process chamber 201 is maintained at a predetermined pressure. For example, the inner pressure of the process chamber 201 may range from 10 Pa to 102,000 Pa, preferably from 101,300 Pa to 101,650 Pa. Thereafter, the microwave oscillator 655 supplies the microwaves into the process chamber 201 through the above-described components such as the electromagnetic wave introduction port 653 and the waveguide 654.

By supplying the microwaves into the process chamber 201, the wafer 200 is heated to a predetermined temperature. For example, the temperature of the wafer 200 may range from 300° C. to 1,000° C., preferably from 600° C. to 900° C., and more preferably from 800° C. to 850° C. By performing the substrate processing at the temperature described above, it is possible to perform the substrate processing at such temperature that the wafer 200 efficiently absorbs the microwaves. Therefore, it is possible to improve the speed of the modification process in the modification step S305.

Specifically, in order to heat the wafer 200 efficiently, that is, in order for the wafer 200 to absorb the microwaves efficiently, it is necessary to consider the temperature dependence of a carrier density of the wafer 200. FIG. 4 illustrates an exemplary relation between the carrier density (which is proportional to the conductivity) and the carrier temperature. The vertical axis of the graph shown in FIG. 4 represents the carrier density and the horizontal axis of the graph shown in FIG. 4 represents the carrier temperature (that is, the temperature of the wafer 200). The graph shown in FIG. 4 may be divided into a region A, a region B and a region C according to the temperature dependence of the carrier density. When the wafer 200 is a silicon (Si) substrate, for example, the boundary temperature between the regions A and B is 327° C., and the boundary temperature between the regions B and C is −73° C. As apparent from FIG. 4, the carrier density increases in the regions A and C as the temperature is raised. However, the carrier density hardly increases in the region B even when the temperature is raised.

In the wafer 200, the amount of the heat generation per unit time is proportional to the carrier density of the wafer 200. Thus, as the carrier density fluctuates, the amount of the heat generation also changes. When the microwave heating is performed in the region A where the change in the carrier density is relatively large, the rate at which the carrier density increases according to the temperature change is relatively high. Therefore, even if the power of the irradiated microwaves is the same, the rate of the temperature increase of the wafer 200 becomes higher. As such, it is preferable to perform the microwave heating in the region A. When it is required to avoid a sharp temperature change of the wafer 200, it is preferable to perform the substrate processing at a temperature close to or same as the boundary temperature between the regions A and B (for example, 300° C. when the silicon substrate is used as the wafer 200). In order to perform the substrate processing in the region A, a cooling gas such as the inert gas may be supplied into the process chamber 201 during the modification process for maintaining the processing temperature. In the first embodiment, for example, the valve 243d is opened to supply the second inert gas as the cooling gas through the gas supply pipe 232d provided with the MFC 241d. In the first embodiment, for example, the $N_2$ gas is supplied as the second inert gas.

The temperature of the wafer 200 may be estimated from the surface temperature of the quartz susceptor 101a measured by the temperature sensor 263 and the temperature conversion data stored in advance in the memory device 121c or in the external storage device 123. The microwave oscillators 655-1 and 655-2 supply the microwaves into the process chamber 201 through the electromagnetic wave introduction ports 653-1 and 653-2 and the waveguides 654-1 and 654-2. Since the microwaves supplied into the process chamber 201 enter the wafer 200 and are absorbed therein efficiently, it is possible to heat the wafer 200 very effectively.

After the wafer 200 is heated to the above-described predetermined processing temperature by controlling the microwave oscillator 655, the processing temperature is maintained for a predetermined time. By controlling the microwave oscillator 655 as described above, the $SiO_2$ film formed on the surface of the wafer 200 is modified by the microwaves. That is, the modification process is performed.

When heating the wafer 200, the microwave oscillators 655-1 and 655-2 may preferably be controlled so as to increase the outputs of the microwave oscillators 655-1 and 655-2 while intermittently supplying the microwaves. That is, it is preferable to combine a pulse control for supplying the microwaves intermittently from the microwave oscillators 655-1 and 655-2 and a power limit control for maintaining the linearity of the outputs of the microwave oscillators 655-1 and 655-2. Standing waves may be generated in the process chamber 201 so that a region (also referred to as a "microwave concentrated region" or a "hot spot") which is intensively heated (i.e., on which the heating in concentrated) may be formed on the surface of the wafer 200. However, according to the first embodiment, the microwaves are supplied while being pulse-controlled during the heating of the wafer 200 as described above. Thus, a time (OFF time) during which no microwave is supplied may be provided according to the first embodiment. By providing the OFF time during which no microwave is supplied, the heat generated in the microwave concentrated region is transferred to the entire surface of the wafer 200. Therefore, the temperature of the wafer 200 becomes uniform throughout the entire surface of the wafer 200. By providing the OFF time during which the heat is transferred to the entire surface of the wafer 200 as described above, it is possible to suppress the microwave concentrated region from being heated intensively. Therefore, by supplying the microwaves while performing the pulse control as described above, it is possible to prevent the microwave concentrated region from being heated intensively, and to suppress the temperature difference between the microwave concentrated region and the other regions of the wafer 200. That is, it is possible to suppress the temperature difference on the surface of the wafer 200 caused by the microwave concentrated region being heated intensively and continuously. It is also possible to suppress the deformation of the wafer 200 such as cracking, warping or distortion caused by the generated temperature difference.

By controlling the microwave oscillator 655 as described above, the wafer 200 is heated to modify the $SiO_2$ formed on the surface of the wafer 200. That is, it is possible to modify the wafer 200 uniformly (S305).

After the predetermined processing time elapses, the rotation of the boat 217, the supply of the gas, the supply of the microwaves and the exhaust of the exhaust pipe are stopped.

<Substrate Unloading Step S306>

After returning the inner pressure of the process chamber 201 to atmospheric pressure, the driving mechanism 267 lowers the placement table 210 to open the furnace opening and unload the boat 217 to the transfer space 203 (boat unloading). Thereafter, the wafer 200 placed on the boat 217 is transferred to the substrate transfer chamber (not shown) provided at the outside the transfer space 203 (S306). By repeating the above-described steps, the wafer 200 is modified.

(3) Comparison Between Presence or Absence of the Hydrogen Atom Addition Step

Hereinafter, the results of comparison between the quality characteristics of the film after the film is modified by the modification process when the hydrogen atom addition step S304 is performed and when the hydrogen atom addition step S304 is not performed will be described with reference to FIGS. 5A through 7. In the specification, the term "wet etch rate (abbreviated as WER)" indicates an etch rate of the silicon oxide film when the silicon oxide film is exposed to pure diluted hydrogen fluoride, and the term "wet etch rate ratio (abbreviated as WERR)" indicates a ratio of a WER of the silicon oxide film with respect to a reference WER. The reference WER is a WER of a silicon oxide film formed by heat treatment for diffusing oxygen (O) on the surface of the substrate (wafer 200) under an oxygen ($O_2$) atmosphere at 900° C. In other words, the WERR indicates a relative ratio of a WER of the silicon oxide film when the reference WER is normalized to 1.

Figure 5A:
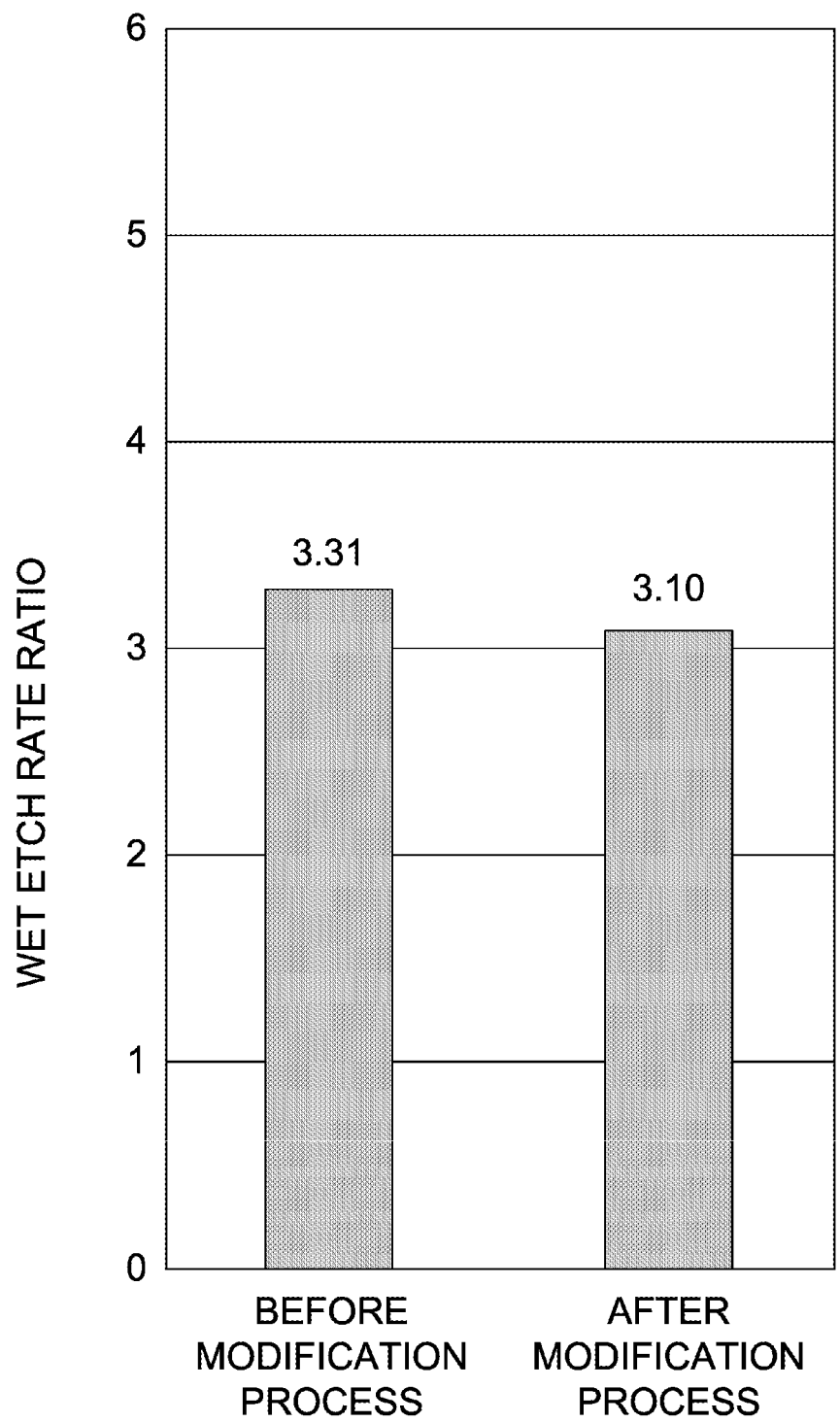

As shown in FIG. 5A, when the wafer 200 is modified without performing the hydrogen atom addition step S304 and the hydrogen content is less than 0.5%, the WERR before the modification step S305 is 3.31 and the WERR after the modification step S305 is 3.10. However, as shown in FIG. 5B, when the wafer 200 is modified with performing the hydrogen atom addition step S304 and the hydrogen content is equal to or greater than 0.5%, the WERR before the modification step S305 is 4.73 and the WERR after the modification step S305 is reduced to 1.75. It is thought that this is because the addition of hydrogen atoms to the surface of the wafer 200 changes the relative dielectric constant by bonding the hydrogen atoms to the wafer 200 and makes it easier to absorb the microwaves so as to enable uniform heating of the wafer 200.

Figure 6:
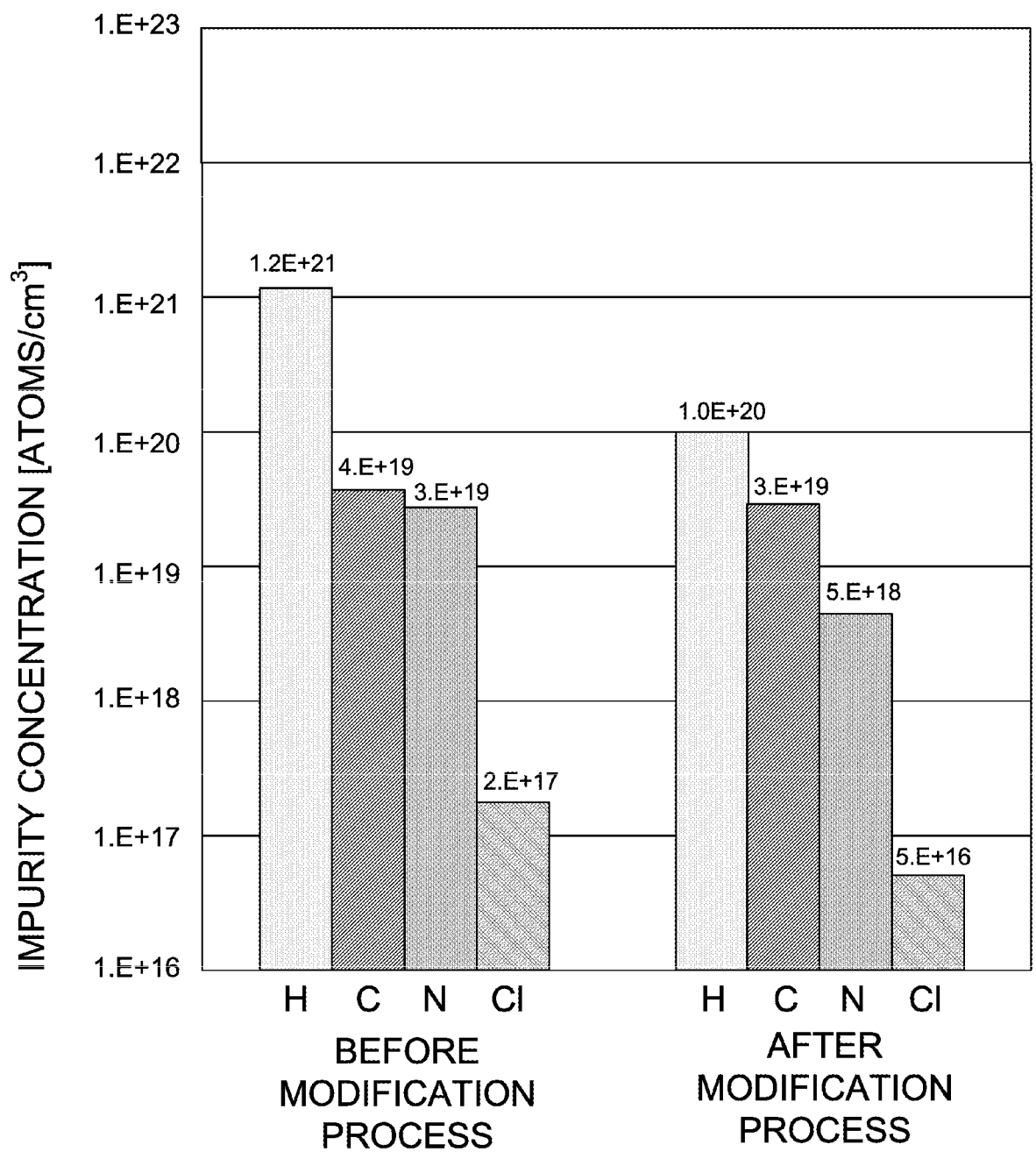
FIG. 6 is a graph showing impurity concentrations of the wafer before and after the modification process wherein the hydrogen addition process is performed for the wafer.

As shown in FIG. 6, comparing impurity concentrations of the wafer 200 before and after the modification step S305 in case the wafer 200 is modified with performing the hydrogen atom addition step S304, all of the concentrations of hydrogen (H) atoms, carbon (C) atoms and nitrogen (N) atoms are lowered.

Figure 7:
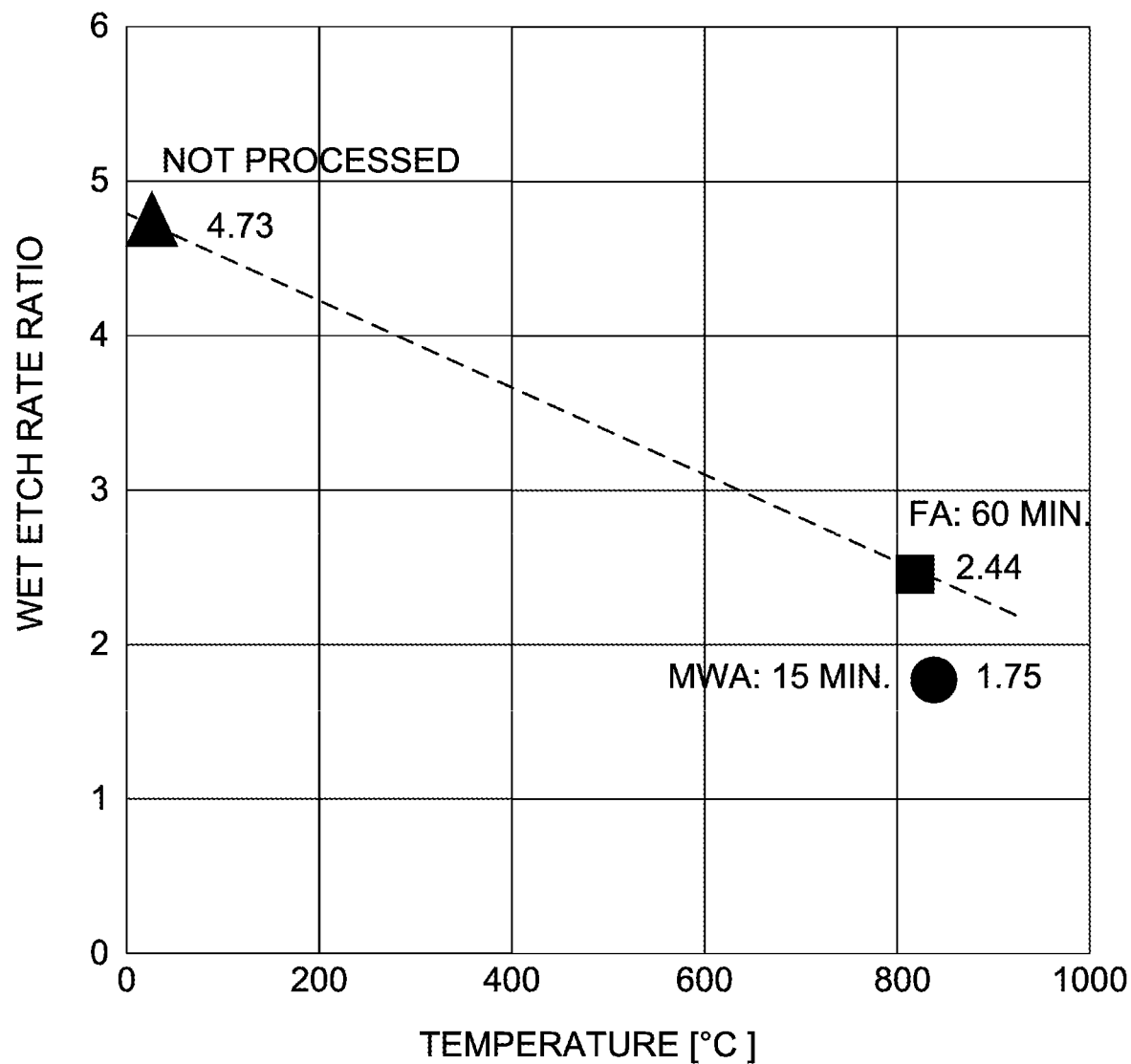
FIG. 7 is a graph showing the wet etch rate ratio according to a processing temperature.

In addition, as shown in FIG. 7, the WERR is reduced to 2.44 in case the wafer 200 is modified by a heater using a resistance heating source (that is, the wafer 200 is modified by "furnace anneal" method) at 830° C. for 60 minutes (indicated by "FA: 60 MIN." in FIG. 7), while the WERR of the wafer 200 (indicated by "NOT PROCESSED" in FIG. 7) is 4.73 in case the wafer 200 is not modified. In addition, the WERR is reduced to 2.44 in case the wafer 200 is modified by the microwave heating at 850° C. for 15 minutes (indicated by "MWA: 15 MIN." in FIG. 7). Compared with the case where the wafer 200 is modified by the heater using the resistance heating source, it is possible to lower the WERR and to shorten the processing time in case the wafer 200 is modified by the microwave heating.

(4) Effects According to the First Embodiment

According to the first embodiment, one or more advantageous effects described below can be achieved.

(a) By continuously performing the modification step S305 after performing the hydrogen atom addition step S304, it is possible to improve the electromagnetic wave absorption efficiency of the wafer 200 and to process the wafer 200 uniformly.

(b) Since the wafer 200 can be processed uniformly, it is possible to reduce the WERR of the wafer 200 (that is, the WER of the wafer 200) greatly.

(c) Since the electromagnetic wave absorption efficiency of the wafer 200 improves, it is possible to shorten the modification processing time of the wafer 200, and it is possible to improve the throughput of the substrate processing.

(d) By setting the hydrogen atom content added to the wafer 200 as 0.5% or more and 80% or less, it is possible to modify the film to be processed efficiently without changing the properties of the film to be processed.

(5) Modified Examples of the First Embodiment

While the first embodiment is described by way of an example in which the substrate processing apparatus as shown in FIG. 1 is used to perform the substrate processing, the first embodiment is not limited thereto. The first embodiment may be modified as in the following modified examples.

First Modified Example

Figure 8:
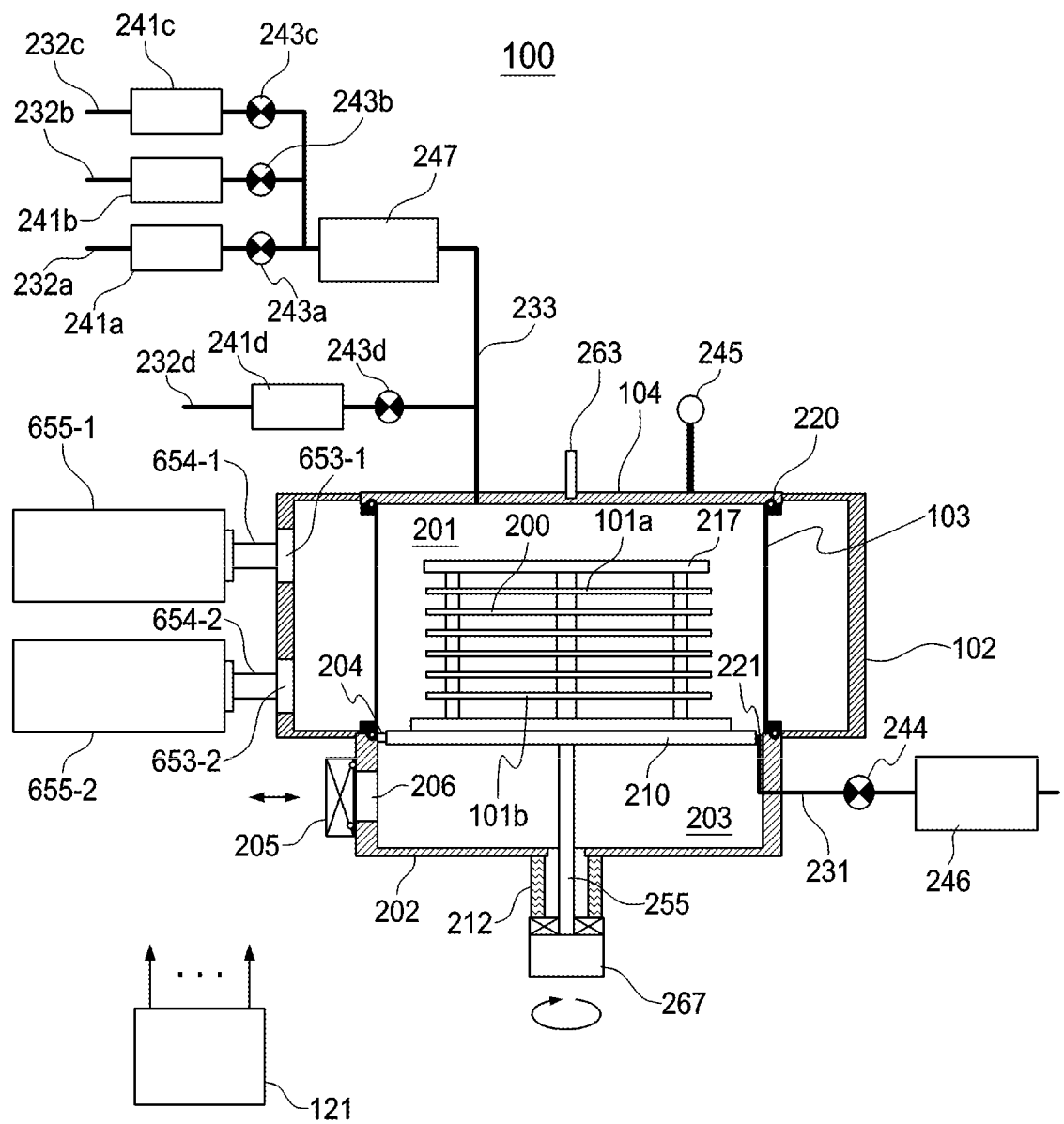
FIG. 8 schematically illustrates a first modified example of the first embodiment.

As shown in FIG. 8, according to a first modified example of the first embodiment, a so-called vertical batch type substrate processing apparatus is used to perform the substrate processing. The vertical batch type substrate processing apparatus includes a boat 217 capable of accommodating and supporting a plurality of wafers 200 in multiple stages. Specifically, the plurality of wafers 200 are horizontally placed in the boat 217 at predetermined intervals between the quartz plates 101a and 101b accommodated in the boat 217. The plurality of wafers 200 is processed uniformly according to the above-described substrate processing. According to the first modified example, it is possible to process the plurality of wafers 200 by a single processing, and it is possible to improve the throughput of the substrate processing.

Second Modified Example

Figure 9:
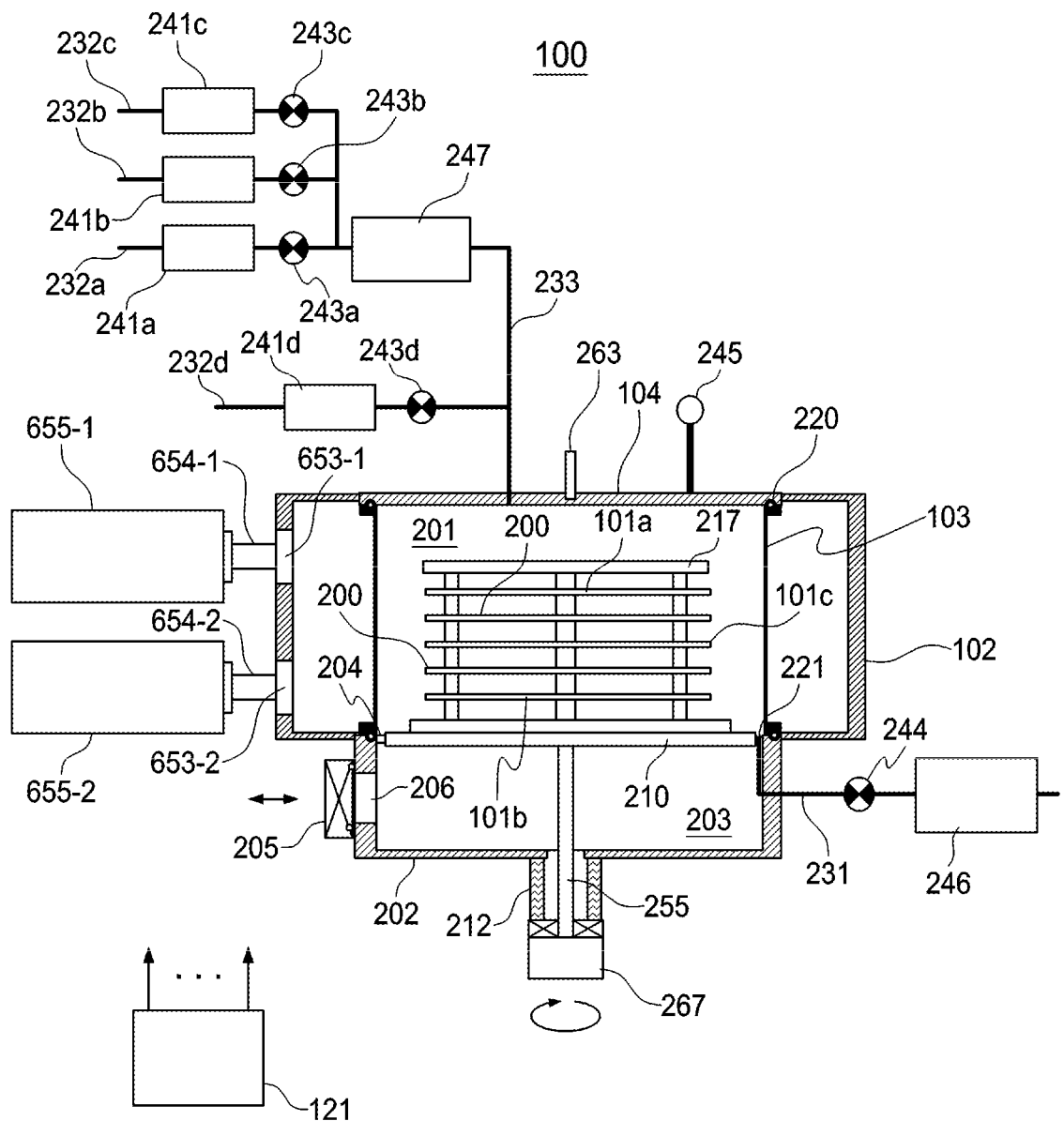
FIG. 9 schematically illustrates a second modified example of the first embodiment.

As shown in FIG. 9, according to a second modified example of the first embodiment, similar to the first modified example, a vertical batch type substrate processing apparatus includes a boat 217 capable of accommodating and supporting a plurality of wafers 200 in multiple stages in the vertical direction. However, while the plurality of wafers 200 are provided between the quartz plates 101a and 101b and processed according to the first modified example, the quartz plate 101c is provided between the wafers 200 and the wafers 200 are necessarily provided between the quartz plates 101 including the quartz plate 101c according to the second modified example. According to the second modified example, it is possible to process the plurality of wafers 200 more uniformly.

Third Modified Example

Figure 10:
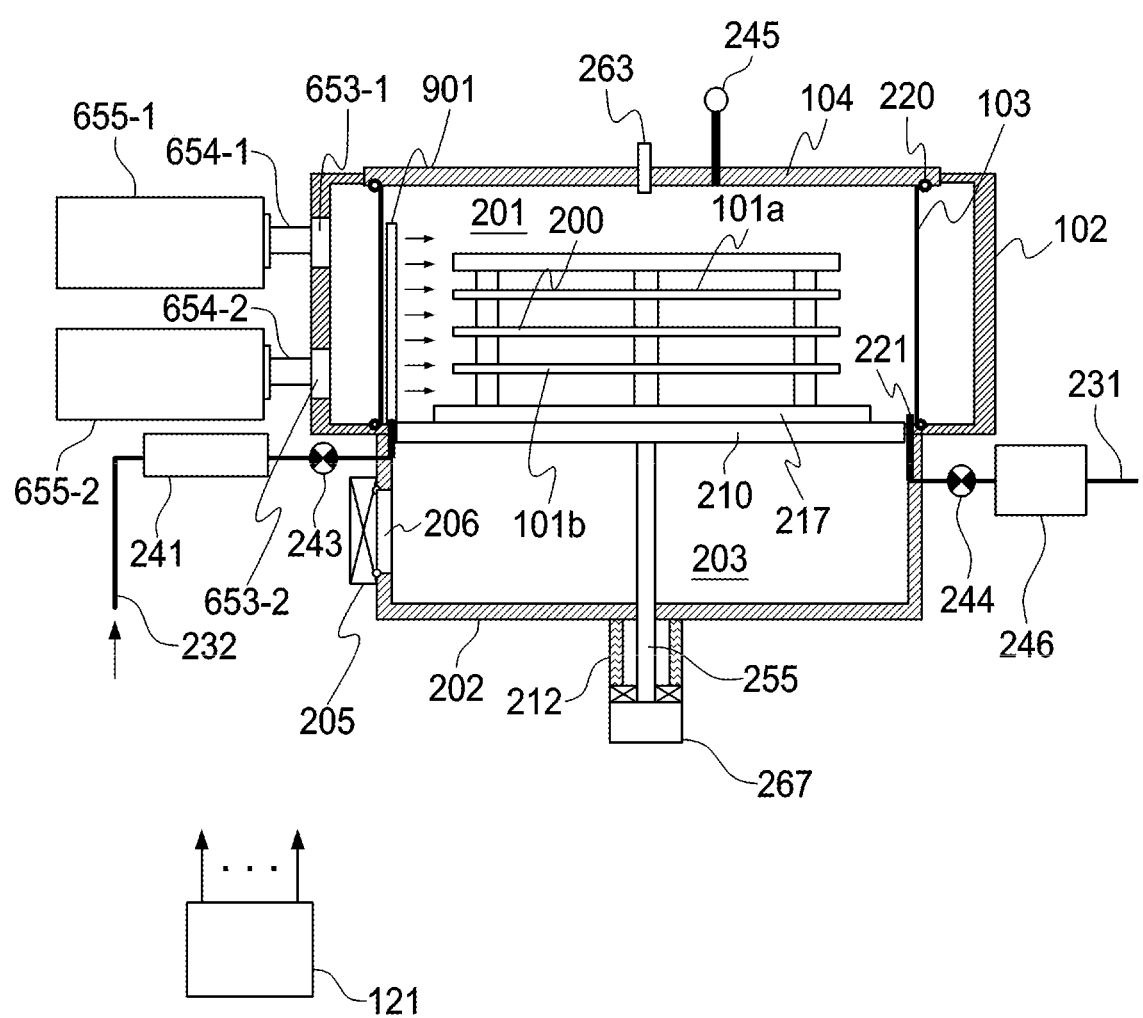
FIG. 10 schematically illustrates a third modified example of the first embodiment.

As shown in FIG. 10, according to a third modified example of the first embodiment, a gas supply nozzle 901 is provided at an end portion of a gas supply pipe 232 at the downstream side of the gas supply pipe 232. The above-described various process gases are supplied through the gas supply pipe 232 provided with an MFC 241 and a valve 243 and the gas supply nozzle 901. According to the third modified example, it is possible to supply the process gases onto the wafer 200 evenly (uniformly), and it is possible to improve a uniformity of the substrate processing on the surface of the wafer 200 in the hydrogen atom addition step S304 and the modification step S305. When a plurality of wafers 200 are placed in a boat 217 in multiple stages according to the third modified example similar to the first modified example and the second modified example, it is also possible to improve the uniformity of the substrate processing between the plurality of wafers 200.

Second Embodiment

Hereinafter, a second embodiment according to the technique will be described with reference to FIGS. 11 and 12. Components of the second embodiment that are the same as the components of the first embodiment will be denoted by like reference numerals, and detailed description thereof will be omitted.

(1) Configuration of Substrate Processing Apparatus

The second embodiment differs from the first embodiment in that, in the substrate processing shown in FIG. 12, an apparatus (or process chamber) for performing the hydrogen atom addition process according to a hydrogen atom addition step S1002 is different from an apparatus (or process chamber) for performing the modification process according to a modification step S1006 in the second embodiment. That is, whereas the hydrogen atom addition step S304 and the modification step S305 are performed by the same apparatus continuously (that is, "in situ" process) in the first embodiment, steps such as an inter-PM substrate transfer step S1004 are performed between the hydrogen atom addition step S1002 and the modification step S1006 and the hydrogen atom addition step S304 and the modification step S305 are performed by different apparatuses (that is, "ex situ" process) in the second embodiment.

Figure 11:
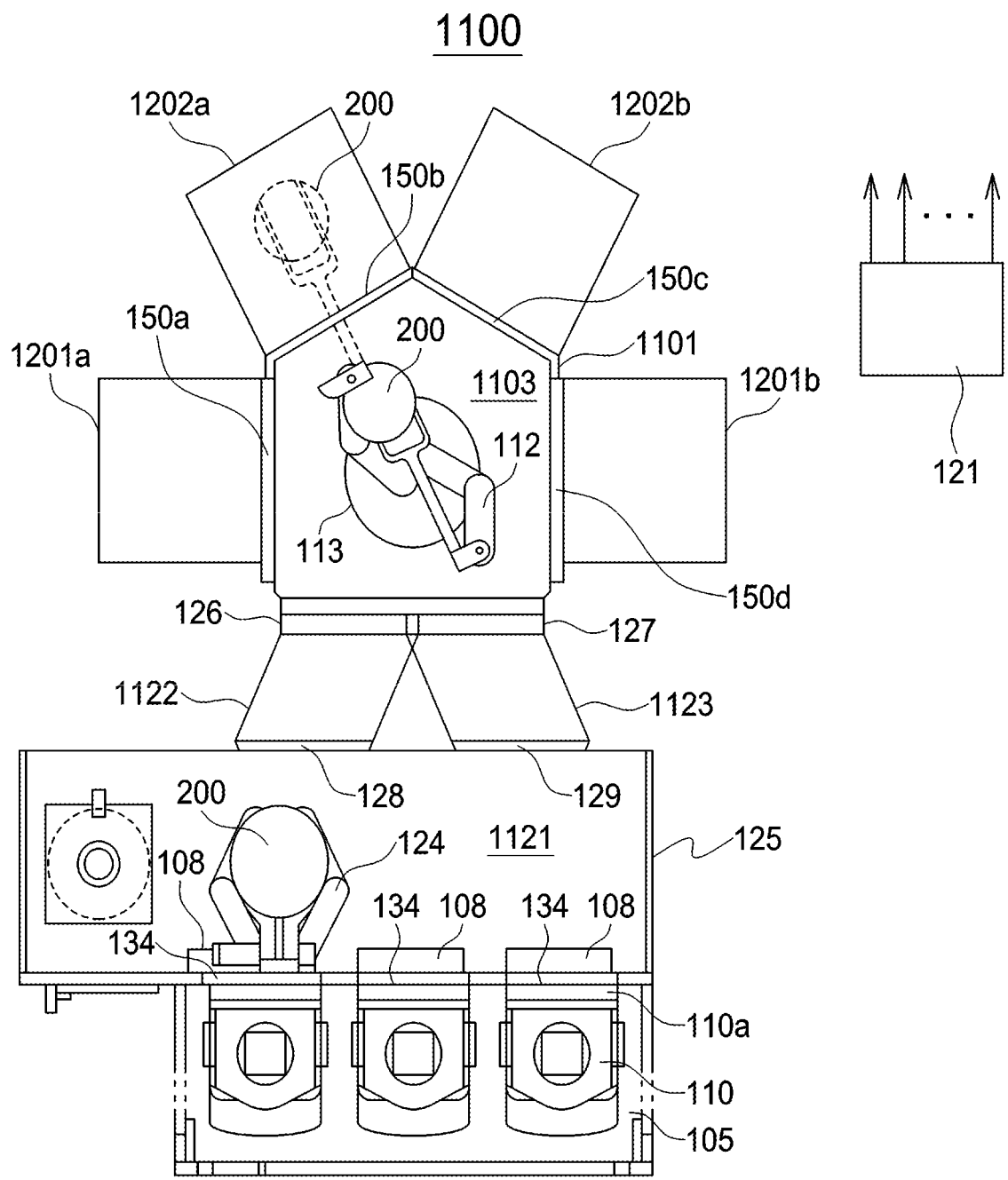
FIG. 11 schematically illustrates a substrate processing apparatus preferably used in a second embodiment described herein.

As shown in FIG. 11, a cluster type processing apparatus having a plurality of process chambers (process modules, abbreviated as "PM") 1201 with a housing 1101 connected to the plurality of process chambers 1201 may be used as a substrate processing apparatus 1100 according to the second embodiment. The substrate processing apparatus 1100 includes process chambers 1201a and 1201b connected to a plasma generator similar to that of the first embodiment where the hydrogen atom addition process is performed; and process chambers 1202a and 1202b connected to an electromagnetic wave supply mechanism similar to that of the first embodiment where the modification process by the electromagnetic wave heating is performed. The process chambers 1201a, 1201b, 1202a and 1202b are connected to a first transfer chamber 1103 via gate valves 150a, 150b, 150c and 150d, respectively. In the present specification, the process chamber 1201a and the process chamber 1201b where the hydrogen atom addition process is performed may be collectively referred to as a process chamber 1201 unless they need to be distinguished separately, and the process chamber 1202a and the process chamber 1202b where the modification process is performed may be collectively referred to as a process chamber 1202 unless they need to be distinguished separately. In addition, the gate valves 150a, 150b, 150c and 150d may be collectively referred to as a gate valve 150.

The substrate processing apparatus 1100 includes the first vacuum transfer chamber 1103 having a load lock chamber structure capable of withstanding a pressure lower than the atmospheric pressure (negative pressure) such as a vacuum state. The housing 1101 of the first transfer chamber 1103 is pentagonal when viewed from above, and is box-shaped with closed upper and lower ends. A first substrate transfer mechanism 112 serving as a first transfer device capable of transferring a plurality of wafers 200 simultaneously under the negative pressure is provided in the first transfer chamber 1103. Alternatively, in the second embodiment, the first substrate transfer mechanism 112 may be a first transfer device capable of transferring a single wafer 200. The first substrate transfer mechanism 112 may be elevated and lowered by a first substrate transfer mechanism elevator 113 serving as an elevating mechanism while maintaining the first vacuum transfer chamber 1103 airtight.

Spare chambers 1122 and 1123, each of which can be used as a spare chamber for both loading and unloading, are connected to two front side walls among five side walls of the housing 1101 via gate valves 126 and 127, respectively. The spare chambers 1122 and 1123 are configured as a structure capable of withstanding the negative pressure, respectively. The plurality of the wafers (for example, two wafers) including the wafer 200 may be stacked in the spare chambers (load lock chambers) 1122 and 1123 by substrate supports (not shown) provided therein.

A substrate loading/unloading port 134 and a pod opener 108 are provided at a housing 125 of a second transfer chamber 1121. The plurality of wafers 200 is loaded into the second transfer chamber 1121 or unloaded out of the second transfer chamber 1121 through substrate loading/unloading port 134. A loading port shelf (TO stage) 105 is provided at the housing 125 opposite to the pod opener 108 via the substrate loading and unloading port 134. The pod opener 108 is configured to open or close a cap 100a of a pod 100. The pod opener 108 includes a closure 142 capable of opening and closing the substrate loading/unloading port 134 and a driving mechanism (not shown) capable of driving the closure 142. When the cap 100a of the pod 100 placed on the loading port shelf 105 is opened, the wafer 200 may be loaded into the pod 100 or unloaded out of the pod 100.

The second transfer chamber 1121 to be used under pressure close to or same as atmospheric pressure is connected to the spare chambers 1122 and 1123 via gate valves 128 and 129. A second substrate transfer mechanism 124 serving as a second transfer device capable of transferring the plurality of wafers 200 is provided in the second transfer chamber 1121. The second substrate transfer mechanism 124 may be elevated and lowered by a second substrate transfer mechanism elevator (not shown) provided in the second transfer chamber 1121 and may reciprocate in a lateral direction by a linear actuator (not shown).

(2) Substrate Processing

Hereinafter, an exemplary sequence of modifying a film such as a silicon oxide ($SiO_2$) film serving as a silicon-containing film formed on the substrate (wafer) 200 in the same manner as in the first embodiment will be described with reference to FIG. 12. The exemplary sequence is performed by using the above-described substrate processing apparatus 1100. Similar to the first embodiment, the components of the substrate processing apparatus 1100 are controlled by the controller 121. In the following substrate processing, a detailed explanation of the steps that can obtain the same effect as in the first embodiment will be omitted.

<Substrate Loading Step (into PM for Adding Hydrogen Atom) S1001>

After the pod 110 is placed on the loading port shelf 105, the cap 110a is opened by the pod opener 108. A predetermined number of wafers including the wafer 200 are loaded into one of the spare chambers 1122 and 1123 by the second substrate transfer mechanism 124. The wafer 200 loaded into the one of the spare chambers 1122 and 1123 is supported by the first substrate transfer mechanism 112 and is loaded into one of the process chambers 1201a and 1201b serving for performing the hydrogen atom addition process (S1001). Hereinafter, the one of the process chambers 1201a and 1201b is also referred to as the process chamber 1201.

<Hydrogen Atom Addition Step S1002>

After the wafer 200 is loaded into the process chamber 1201, a gas containing hydrogen atoms (that is, the hydrogen-containing gas) serving as a process gas is supplied into the process chamber 1201 while maintaining the inner pressure and temperature of the process chamber 1201 at a predetermined pressure and temperature, and the gas containing hydrogen atoms is plasma-excited. Thereby, the hydrogen atom addition process is performed (S1002). Although the temperature of the wafer 200 is elevated by the electromagnetic wave supply mechanism serving as the heating device in the hydrogen atom addition step S304 of the first embodiment, the second embodiment is not limited thereto. For example, the temperature of the wafer 200 may be elevated by the electromagnetic wave supply mechanism or by the heater using the resistance heating source. Similar to the first embodiment, a gas such as hydrogen ($H_2$) gas, $H_2O$ gas, $H_2O_2$ gas, a gas containing deuterium (D), or a gaseous mixture thereof may be used as the hydrogen-containing gas. For example, the processing conditions of the hydrogen atom addition step S1002 are the same as those of the hydrogen atom addition step S304 of the first embodiment.

<Substrate Unloading Step (from PM for Adding Hydrogen Atom) S1003>

After the hydrogen atom addition step S1002 is completed, the wafer 200 on which the hydrogen atom addition process is performed is unloaded out of the process chamber 1201 while being supported by the first substrate transfer mechanism 112.

<Inter-PM Substrate Transfer Step S1004>

The wafer 200 unloaded out of the process chamber 1201 is transferred to one of the process chambers 1202a and 1202b for performing the modification process while being supported by the first substrate transfer mechanism 112 (S1004). Hereinafter, the one of the process chambers 1202a and 1202b is also referred to as the process chamber 1202.

<Substrate Loading Step (into PM for Annealing) S1005>

The wafer 200 is loaded into the process chamber 1202 serving as an annealing apparatus while being supported by the first substrate transfer mechanism 112 (S1005).

<Modification Step S1006>

After the wafer 200 is loaded into the process chamber 1202, an inert gas is supplied into the process chamber 1202 and the microwaves are supplied from the microwave oscillator 655. By supplying the microwaves, the wafer 200 is heated uniformly, and the $SiO_2$ film formed on the surface of the wafer 200 is modified. That is, it is possible to modify the wafer 200 uniformly (S1006).

<Substrate Unloading Step (from PM for Annealing) S1007>

After the modification step S1006 is completed, the wafer 200 on which the modification process is performed is unloaded out of the process chamber 1202 while being supported by the first substrate transfer mechanism 112 (S1007). Thereafter, the wafer 200 is loaded into one of the spare chambers 1122 and 1123 while being supported by the first substrate transfer mechanism 112, and is transferred to the pod 110 by the second substrate transfer mechanism 124. By performing the above-described steps, the hydrogen atom addition process and the modification process according to the second embodiment are performed.

(3) Effects According to the Second Embodiment

According to the second embodiment, one or more advantageous effects described below can be achieved.

(e) According to the second embodiment, it is possible to perform the hydrogen atom addition process and the modification process in different apparatuses, that is, in different processing chambers. In addition, it is possible to simplify the control of the gas supply or the inner pressure of the process chamber in the hydrogen atom addition process and the modification process.

(f) According to the second embodiment, the hydrogen atom addition process and the modification process are performed in different process chambers. Therefore, the next unprocessed wafer can be processed in one of the process chambers when the process assigned thereto is completed. As a result, it is possible to improve the throughput.

Third Embodiment

Hereinafter, a third embodiment according to the technique will be described with reference to FIG. 13. The third embodiment is different from the second embodiment in that a base film (underlying film) is formed on the wafer 200 by supplying the source gas for forming the film and the process gas serving as the reactive gas into the apparatus (PM) for performing the hydrogen atom addition process (that is, the process chambers 1201a and 1201b described in the second embodiment) through the source gas supply system and the reactive gas supply system, respectively. Since the configuration of the substrate processing apparatus used in the third embodiment is the same as that of the substrate processing apparatus in FIG. 11, a detailed description thereof will be omitted. In addition, the hydrogen atom addition step S1002, the substrate unloading step (from PM for Film-Forming and Adding Hydrogen Atom) S1003, the inter-PM substrate transfer step S104, the substrate loading step (PM for annealing) S1005, the modification step S1006 and the substrate unloading step (from PM for Annealing) S1007 according to the third embodiment are substantially the same as those of the second embodiment, a detailed description thereof will be omitted in the following description of the substrate processing.

(1) Substrate Processing

<Substrate Loading Step (into PM for Film-Forming and Adding Hydrogen Atom) S1001>

As shown in FIG. 13, similar to the second embodiment, the unprocessed wafer 200 is loaded into the process chambers 1201 serving as an apparatus for performing a film-forming process and the hydrogen atom addition process by the first substrate transfer mechanism 112.

<Film-Forming Step 1302>

After the unprocessed wafer 200 is loaded into the process chamber 1201, the source gas, the reactive gas and the purge gas are simultaneously or alternately supplied at predetermined timings to form a predetermined film.

For example, when forming the $SiO_2$ film as the base film, bis(tertiarybutylamino)silane gas ($SiH_2[NH(C_4H_9)]_2$, abbreviated as BTBAS) gas may be used as the source gas, and a reactant having a different chemical structure from the source gas such as oxygen ($O_2$) gas serving as a oxygen (O)-containing gas may be used as the reactive gas. The $N_2$ gas serving as an inert gas may be used as the purge gas.

For example, when forming the $SiO_2$ film as the base film, first, the BTBAS gas serving as the source gas is supplied into the process chamber 1201 to form a silicon-containing layer, a BTBAS adsorption layer or both of the silicon-containing layer and the BTBAS adsorption layer. After the silicon-containing layer, the BTBAS adsorption layer or both of the silicon-containing layer and the BTBAS adsorption layer are formed on the surface of the wafer 200, the $N_2$ gas is supply into the process chamber 1201 to purge the inside of the process chamber 1201. After the inside of the process chamber 1201 is purged, the $O_2$ gas activated by plasma or by heating by the heater is supplied to the surface of the wafer 200. The activated $O_2$ gas reacts with the silicon-containing layer, the BTBAS adsorption layer or both of the silicon-containing layer and the BTBAS adsorption layer formed on the surface of the wafer 200 to form the $SiO_2$ film on the surface of the wafer 200. After the $O_2$ gas is supplied, the $N_2$ gas may be supplied into the process chamber 1201 again to purge the inside of the process chamber 1201 if necessary. By performing the step of supplying the source gas, the purge gas, the reactive gas and the purge gas in order a predetermined number of times, it is possible to form the $SiO_2$ film having a desired film thickness on the surface of the wafer 200 (S1302).

<Purging Step S1303>

After the predetermined base film is formed, the $N_2$ gas is supplied into the process chamber 1201 to purge a residual gas remaining in the process chamber 1201 (S1303). Thereby, the purging step S1301 is performed.

(2) Effects According to the Third Embodiment

According to the third embodiment, advantageous effect described below can be achieved.

(g) By forming the base film in the process chamber where the hydrogen atom addition step is performed, the film-forming step for forming the base film and the hydrogen atom addition step for adding hydrogen atoms to the base film are continuously performed (that is, "in situ" process). As a result, it is possible to improve the efficiency of the substrate processing.

Other Embodiments

While the technique is described by way of the above-described embodiments and the modified examples, the above-described technique is not limited thereto. The above-described technique may be modified in various ways without departing from the gist thereof. For example, above-described embodiments and the modified examples may be appropriately combined. The same advantageous effects can be obtained when the embodiments and the modified examples are appropriately combined.

While the above-described embodiments are described by way of an example in which the $SiO_2$ film serving as the base film is modified, the above-described technique is not limited thereto. Instead of the $SiO_2$ film, for example, an amorphous silicon film may be modified to a polycrystalline silicon film (poly silicon film). The above-described technique may be applied to modify a film formed on the surface of the wafer 200 by supplying a gas containing at least one of oxygen (O), nitrogen (N), carbon (C) and hydrogen (H). When, for example, forming a hafnium oxide film ($Hf_xO_y$ film) serving as a high dielectric film on the wafer 200, the deficient oxygen in the hafnium oxide film can be supplemented and the characteristics of the high dielectric film can be improved by supplying the microwaves to heat the wafer 200 while supplying a gas containing oxygen. While the hafnium oxide film is mentioned above as an example, the above-described technique is not limited thereto. For example, the above-described technique may be applied to modify a metal-base oxide film, that is, an oxide film containing at least one metal element such as aluminum (Al), titanium (Ti), zirconium (Zr), tantalum (Ta), niobium (Nb), lantern (La), cerium (Ce), yttrium (Y), barium (Ba), strontium (Sr), calcium (Ca), lead (Pb), molybdenum (Mo) and tungsten (W). That is, the above described substrate processing may be preferably applied to modify a film formed on the wafer 200 such as a TiOCN film, a TiOC film, a TiON film, a TiO film, a ZrOCN film, a ZrOC film, a ZrON film, a ZrO film, a HfOCN film, a HfOC film, a HfON film, a HfO film, a TaOCN film, a TaOC film, a TaON film, a TaO film, a NbOCN film, NbOC film, a NbON film, a NbO film, a AlOCN film, a AlOC film, a AlON film, a AlO film, a MoOCN film, a MoOC film, a MoON film, a MoO film, a WOCN film, a WOC film, a WON film and a WO film.

Without being limited to the high dielectric film, it is also possible to heat a film containing silicon as a main element and doped with impurities. A silicon-containing film such as a silicon nitride film (SiN film), a silicon oxycarbide film (SiOC film), a silicon oxycarbonitride film (SiOCN film)

and a silicon oxynitride film (SiON film) may be used as the above-mentioned film containing silicon as a main element. For example, the impurities may include at least one element such as boron (B), carbon (C), nitrogen (N), aluminum (Al), phosphorus (P), gallium (Ga) and arsenic (As).

In addition, the above-described technique may be applied to modify a resist film based on at least one of methyl methacrylate resin (polymethyl methacrylate, PMMA), epoxy resin, novolac resin and polyvinyl phenyl resin.

In addition, a gas containing hydrogen atoms may be used as the source gas or the reactive gas to form the base film so that the base film contains a large amount of hydrogen atoms.

While the above-described embodiments are described by way of an example in which the substrate processing is performed as one of manufacturing processes of the semiconductor device, the above-described technique is not limited thereto. For example, the above-described technique may be applied to a substrate processing such as patterning process of a manufacturing process of a liquid crystal panel, a patterning process of a manufacturing process of a solar cell and a patterning process of a manufacturing process of a power device.

According to the technique described herein, it is possible to heat a substrate uniformly by electromagnetic waves.

What is claimed is:

1. A substrate processing apparatus comprising:
   a process chamber where a substrate is processed;
   a heating device configured to heat the substrate by microwaves;
   a gas supply mechanism comprising a hydrogen-containing gas supply system configured to supply a hydrogen-containing gas into the process chamber;
   a plasma generator configured to excite the hydrogen-containing gas by plasma; and
   a controller configured to control each of the heating device, the gas supply mechanism and the plasma generator to modify the substrate by performing: (a) adding hydrogen atom to a surface of the substrate by supplying the hydrogen-containing gas excited by the plasma generator onto the substrate; and (b) intermittently supplying the microwaves while increasing an output of the heating device to heat the substrate after performing (a).

2. The substrate processing apparatus of claim 1, wherein the controller is further configured to control each of the heating device, the gas supply mechanism and the plasma generator to perform (b) immediately after (a) is completed.

3. The substrate processing apparatus of claim 1, wherein the process chamber comprises:
   a first process chamber connected to the plasma generator wherein (a) is performed in the first process chamber; and
   a second process chamber connected to the heating device wherein (b) is performed in the second process chamber.

4. The substrate processing apparatus of claim 1, wherein the gas supply mechanism further comprises:
   a source gas supply system configured to supply a source gas into the process chamber; and
   a reactive gas supply system configured to supply a reactive gas into the process chamber, and wherein the controller is further configured to control each of the heating device, the gas supply mechanism and the plasma generator to perform: (c) forming a predetermined film on the surface of the substrate by supplying the source gas and the reactive gas onto the surface of the substrate before performing (a).

5. The substrate processing apparatus of claim 1, wherein the controller is further configured to control each of the heating device, the gas supply mechanism and the plasma generator to add hydrogen atom so that a hydrogen atom content is 0.5% or more.

6. The substrate processing apparatus of claim 1, wherein the controller is further configured to control each of the heating device, the gas supply mechanism and the plasma generator to add hydrogen atom so that a hydrogen atom content is 80% or less.

7. The substrate processing apparatus of claim 1, wherein the controller is further configured to control the heating device to raise a temperature of the substrate before (a) is performed to a predetermined substrate processing temperature by applying an output of the heating device lower than that of the heating device in (b).

8. The substrate processing apparatus of claim 1, wherein the heating device comprises a plurality of microwave oscillators provided on sidewalls of the process chamber.

9. The substrate processing apparatus of claim 1, wherein an oxide film is formed on the substrate, and the hydrogen-containing gas excited by the plasma generator reacts with the oxide film so that hydrogen atom is added into the oxide film.

10. A method of manufacturing a semiconductor device using a substrate processing apparatus comprising: a process chamber where a substrate is processed; a heating device configured to heat the substrate by microwaves; a gas supply mechanism comprising a hydrogen-containing gas supply system configured to supply a hydrogen-containing gas into the process chamber; and a plasma generator configured to excite the hydrogen-containing gas by plasma, the method comprising:
    (a) loading the substrate into the process chamber;
    (b) adding hydrogen atom to a surface of the substrate by supplying the hydrogen-containing gas excited by the plasma generator onto the substrate; and
    (c) modifying the substrate where hydrogen atom is added by intermittently supplying the microwaves into the process chamber by the heating device while increasing an output of the heating device.

11. The method of claim 10, wherein (c) is performed immediately after (b) is completed.

12. The method of claim 10, further comprising:
    (d) forming a predetermined film on the surface of the substrate by supplying a source gas and a reactive gas into the process chamber before performing (b).

13. A non-transitory computer-readable recording medium storing a program used for a substrate processing apparatus comprising: a process chamber where a substrate is processed; a heating device configured to heat the substrate by microwaves; a gas supply mechanism comprising a hydrogen-containing gas supply system configured to supply a hydrogen-containing gas into the process chamber; and a plasma generator configured to excite the hydrogen-containing gas by plasma, wherein the program causes the substrate processing apparatus to perform:
    (a) loading the substrate into the process chamber;
    (b) adding hydrogen atom to a surface of the substrate by supplying the hydrogen-containing gas excited by the plasma generator onto the substrate; and
    (c) modifying the substrate where hydrogen atom is added by intermittently supplying the microwaves into the process chamber by the heating device while increasing an output of the heating device.

14. The non-transitory computer-readable recording medium of claim 13, wherein (c) is performed immediately after (b) is completed.

15. The non-transitory computer-readable recording medium of claim 13, further comprising:
(d) forming a predetermined film on the surface of the substrate by supplying a source gas and a reactive gas into the process chamber before performing (b).

* * * * *